United States Patent
Takizawa et al.

(10) Patent No.: US 10,497,446 B2
(45) Date of Patent: Dec. 3, 2019

(54) MEMORY SYSTEM CONTROLLING DATA ERASE FOR NONVOLATILE MEMORY AND CONTROL METHOD FOR ERASING DATA

(71) Applicant: Toshiba Memory Corporation, Minato-ku (JP)

(72) Inventors: Kazutaka Takizawa, Yokohama (JP); Masaaki Niijima, Machida (JP)

(73) Assignee: Toshiba Memory Corporation, Minato-ku (JP)

( * ) Notice: Subject to any disclaimer, the term of this patent is extended or adjusted under 35 U.S.C. 154(b) by 5 days.

(21) Appl. No.: 15/890,427

(22) Filed: Feb. 7, 2018

(65) Prior Publication Data

US 2018/0286485 A1    Oct. 4, 2018

(30) Foreign Application Priority Data

Mar. 29, 2017  (JP) .................. 2017-065674

(51) Int. Cl.
    *G11C 16/34*    (2006.01)
    *G11C 16/14*    (2006.01)
    *G11C 16/04*    (2006.01)
    *G11C 16/16*    (2006.01)

(52) U.S. Cl.
    CPC .......... *G11C 16/14* (2013.01); *G11C 16/0483* (2013.01); *G11C 16/16* (2013.01); *G11C 16/3445* (2013.01)

(58) Field of Classification Search
    CPC ................................................ G11C 16/3445
    USPC .................................................. 365/185.22
    See application file for complete search history.

(56) References Cited

U.S. PATENT DOCUMENTS

| | | | |
|---|---|---|---|
| 8,976,597 B2 | 3/2015 | Shiino et al. | |
| 2002/0101763 A1* | 8/2002 | Hosogane | G11C 16/22 365/185.22 |
| 2004/0210729 A1 | 10/2004 | Horii et al. | |
| 2014/0098615 A1* | 4/2014 | Mu | G11C 16/344 365/185.22 |
| 2014/0269090 A1* | 9/2014 | Flynn | G11C 16/14 365/185.19 |
| 2016/0064096 A1* | 3/2016 | Micheloni | G11C 16/349 365/185.12 |
| 2017/0117032 A1 | 4/2017 | Takizawa et al. | |
| 2018/0061496 A1* | 3/2018 | Senoo | G11C 16/0483 |

FOREIGN PATENT DOCUMENTS

| | | |
|---|---|---|
| JP | 2003-036681 | 2/2003 |
| JP | 2012-069185 | 4/2012 |
| JP | 2012-169020 | 9/2012 |

* cited by examiner

*Primary Examiner* — Min Huang
(74) *Attorney, Agent, or Firm* — Oblon, McClelland, Maier & Neustadt, L.L.P.

(57) ABSTRACT

According to one embodiment, a memory system includes a memory and controller. The controller repeatedly performs an erase voltage application process for data stored in a target area in the memory. The controller performs an erase verification process for determining whether the erase is successful using erase verification voltage. The controller determines whether an erase time is longer than a first threshold value. The controller sets the target area to a use prohibition state when the erase time is longer than the first threshold value.

16 Claims, 19 Drawing Sheets

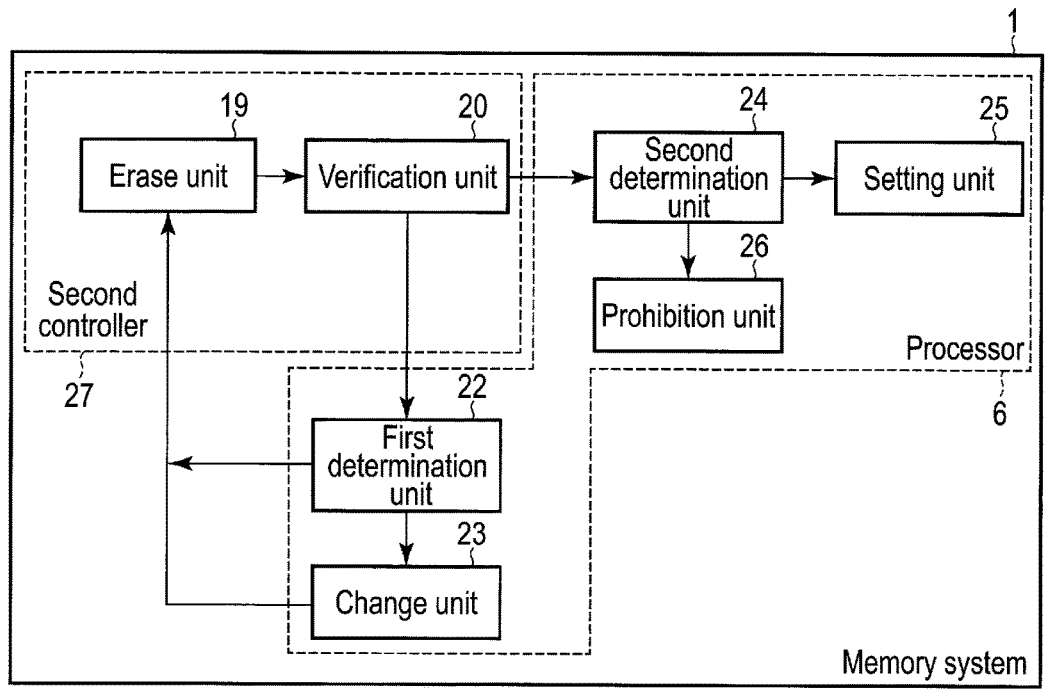
F I G. 2
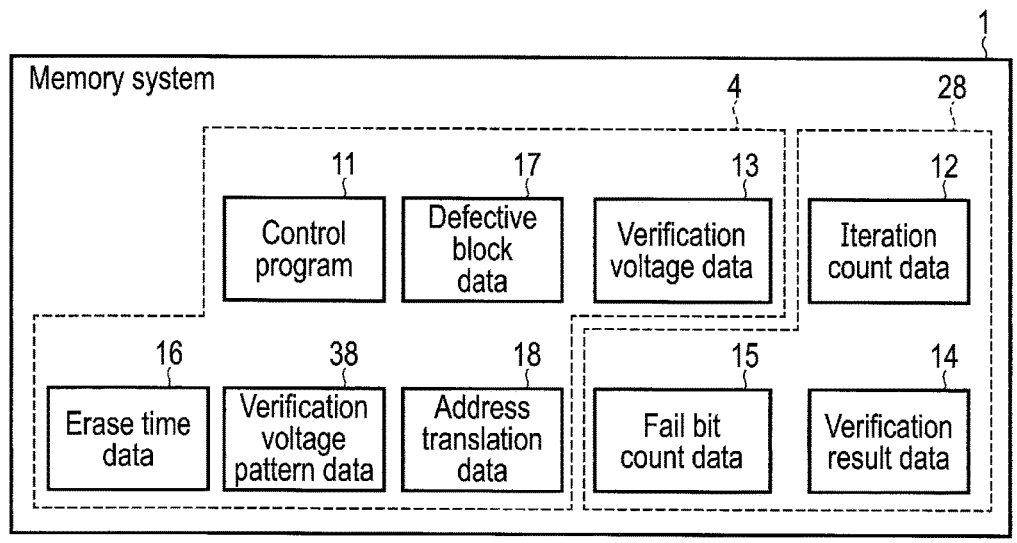
F I G. 3

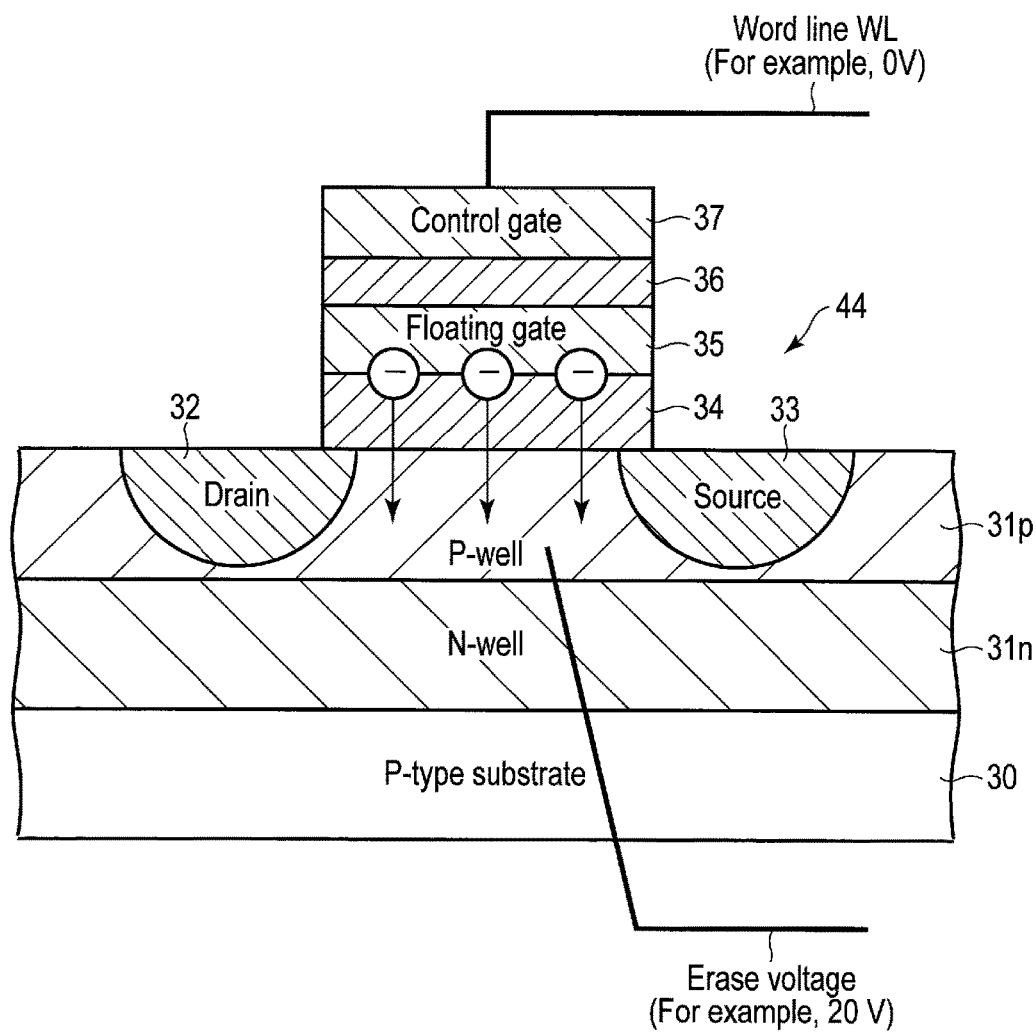
F I G. 5

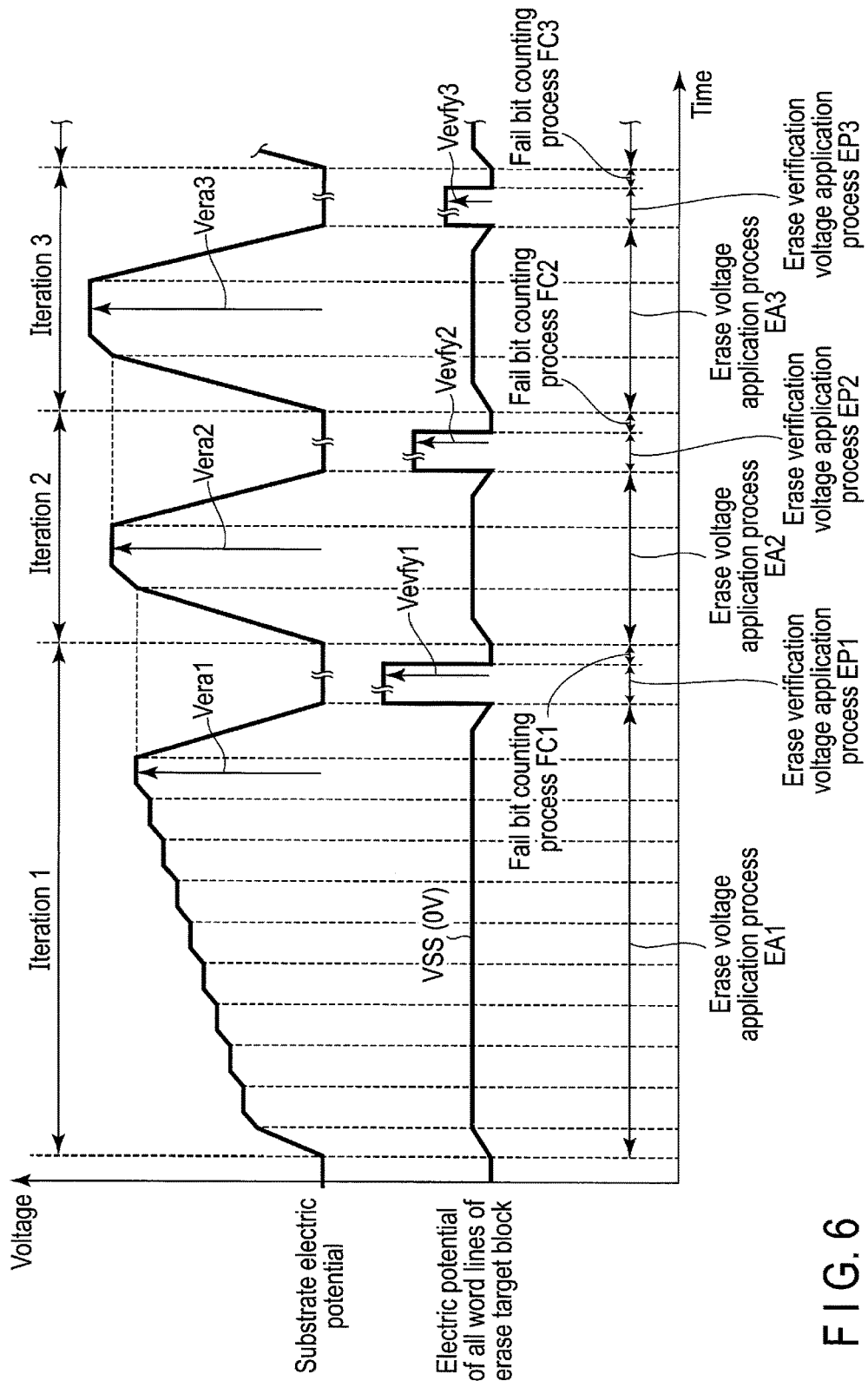
F I G. 6

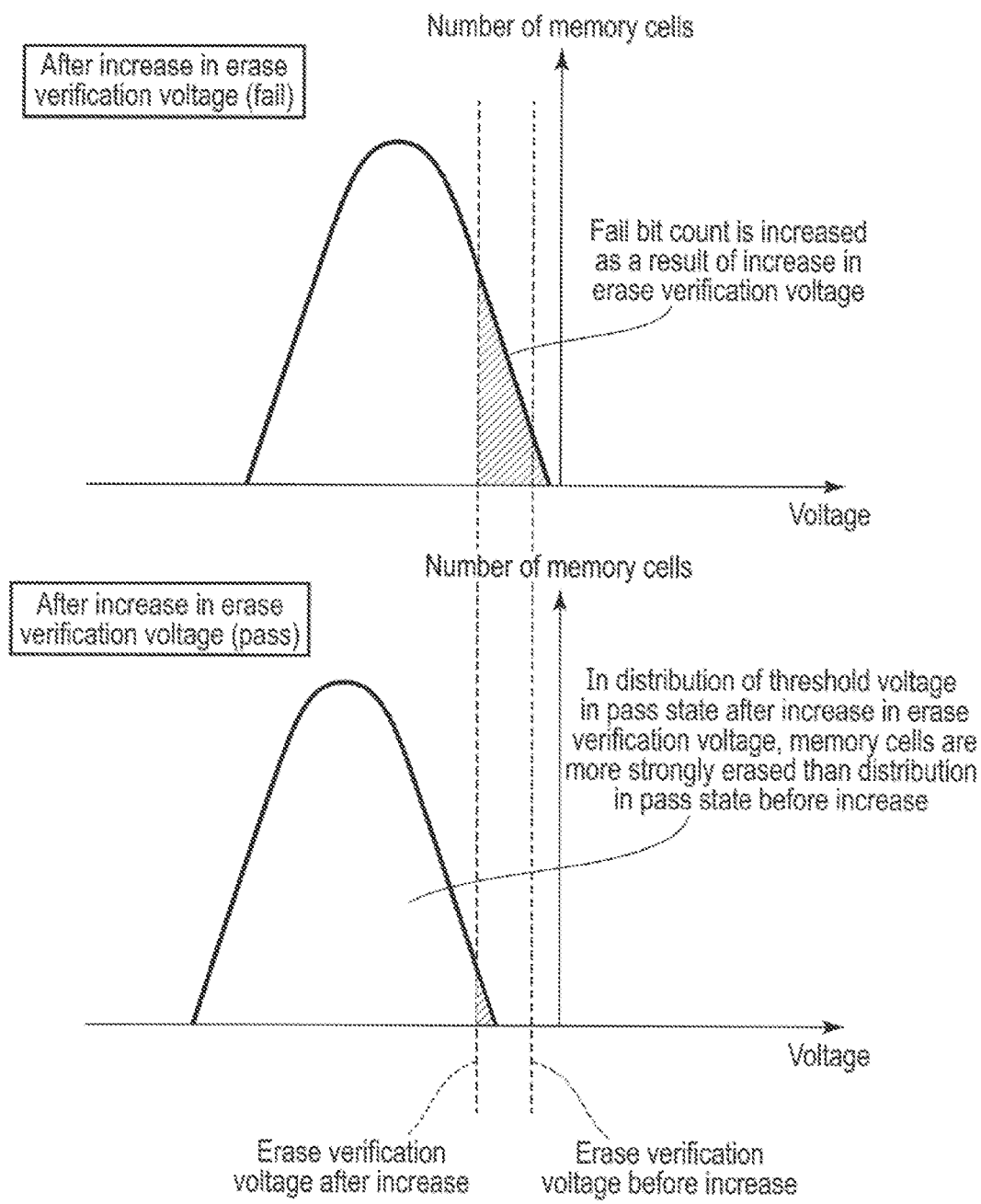
F I G. 9

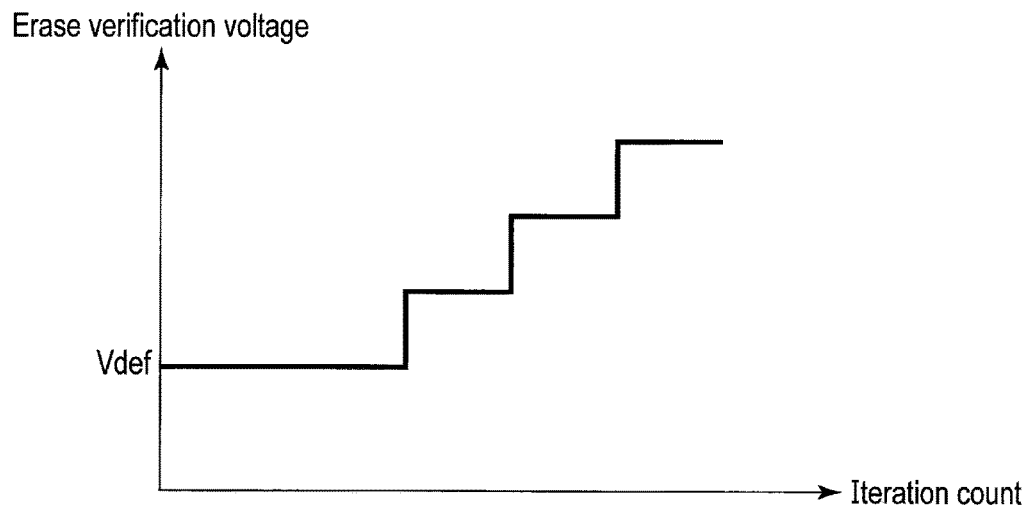
F I G. 10
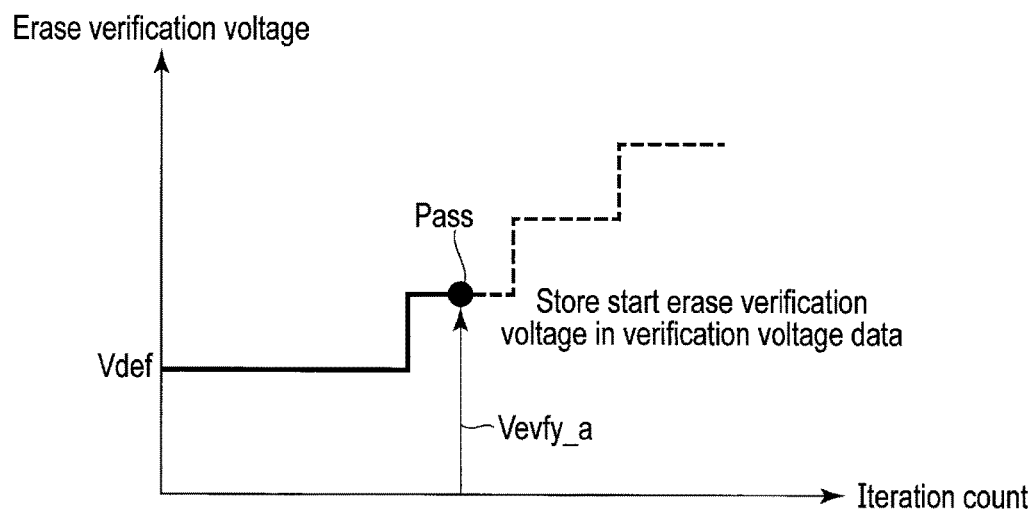
F I G. 11

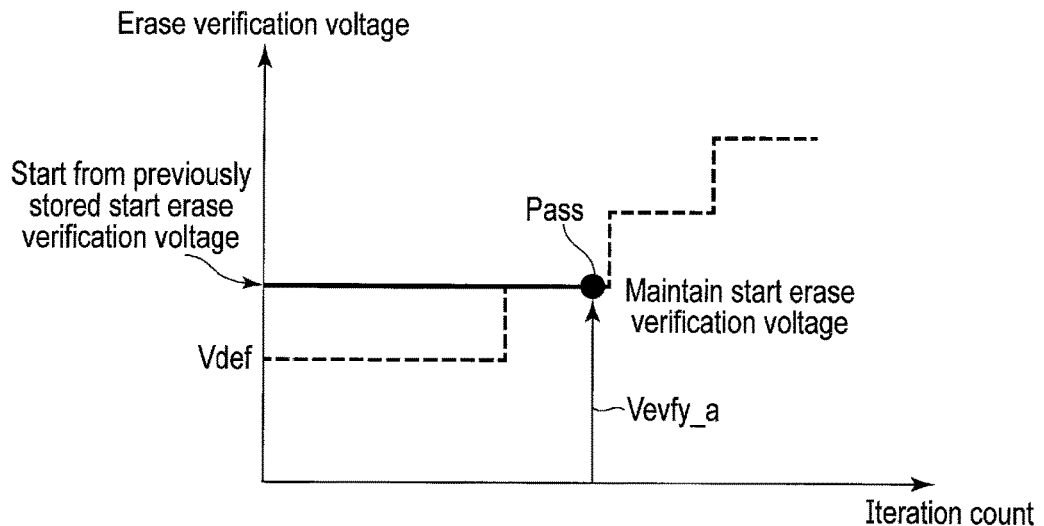
F I G. 12
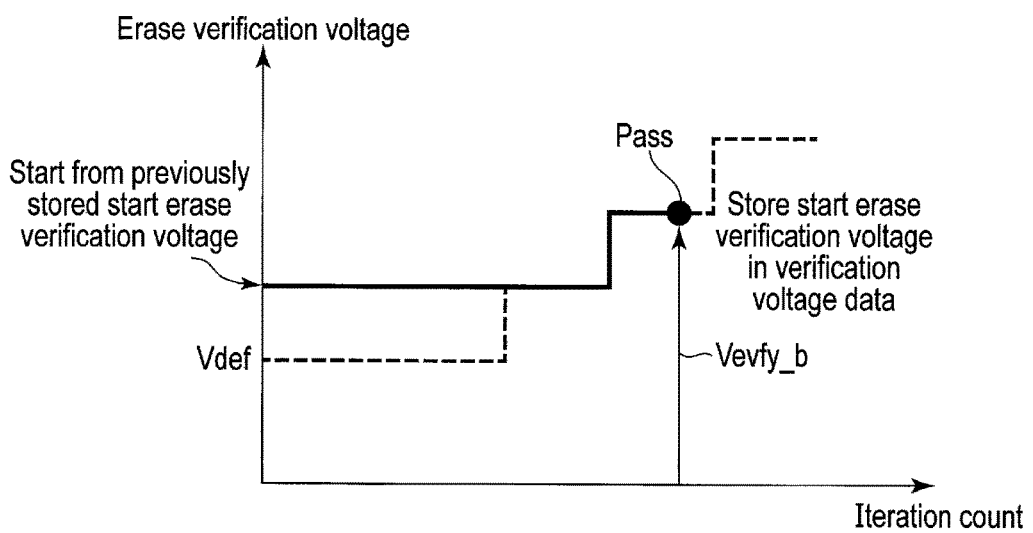
F I G. 13

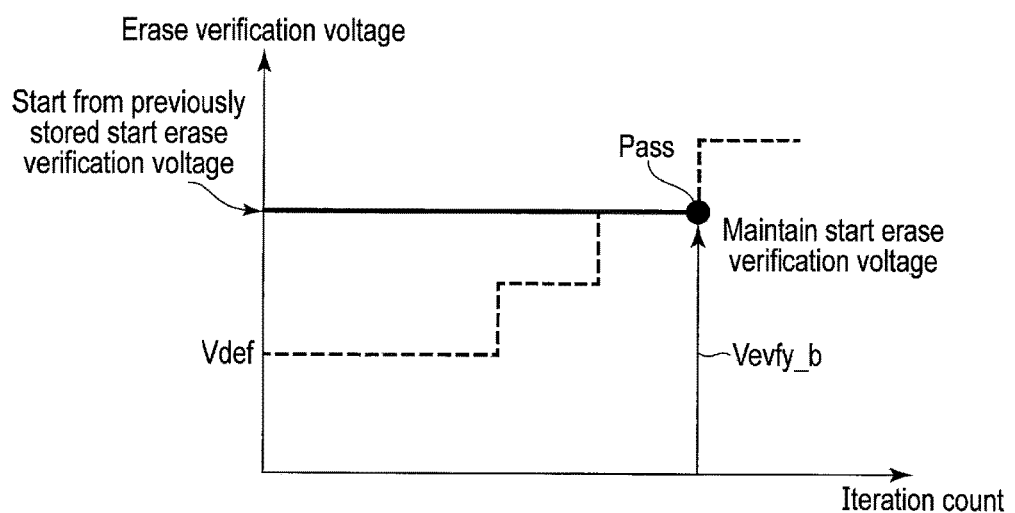
F I G. 14

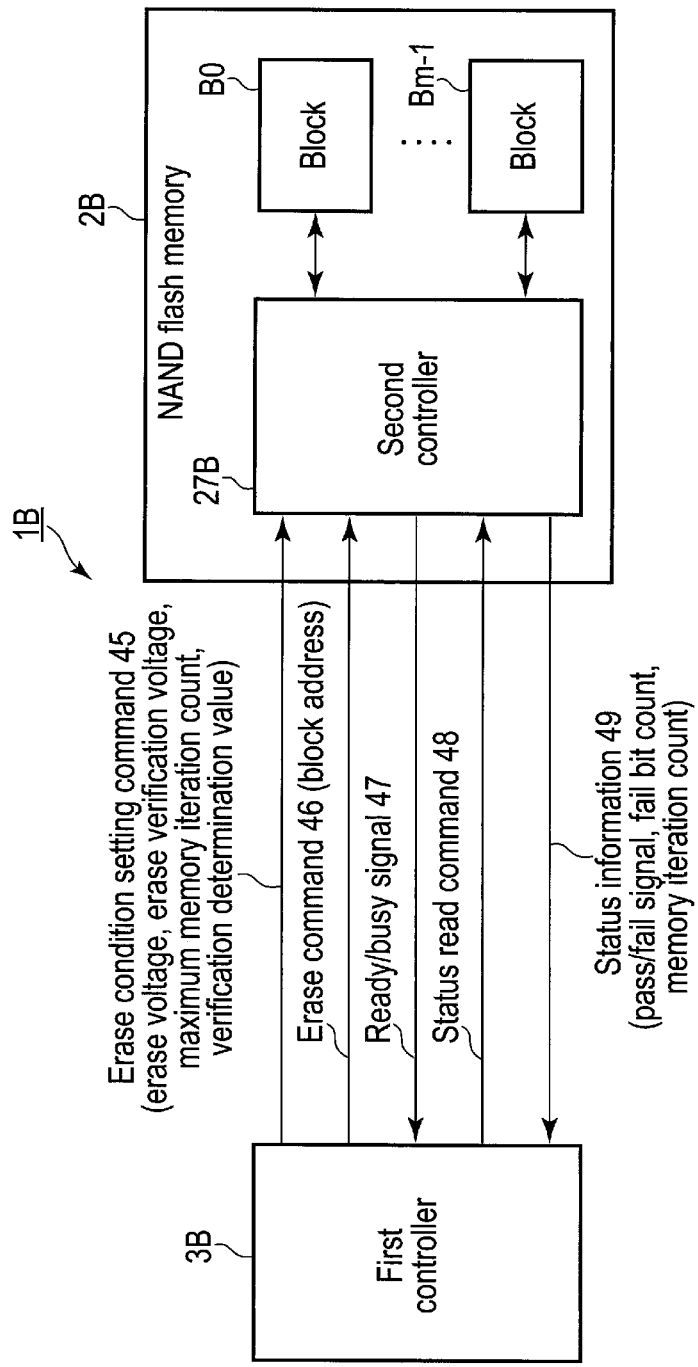
F I G. 17

MEMORY SYSTEM CONTROLLING DATA ERASE FOR NONVOLATILE MEMORY AND CONTROL METHOD FOR ERASING DATA

CROSS-REFERENCE TO RELATED APPLICATIONS

This application is based upon and claims the benefit of priority from Japanese Patent Application No. 2017-065674, filed Mar. 29, 2017, the entire contents of which are incorporated herein by reference.

FIELD

Embodiments described herein relate generally to a memory system including a nonvolatile memory and its control method for erasing data.

BACKGROUND

An example of nonvolatile memories is a NAND flash memory. In a NAND flash memory, when the application of program (write) voltage or erase voltage to a memory cell is repeated, a tunnel oxide film of the memory cell is degraded. Thus, an error may occur in a program, reading or erasing for the memory cell.

BRIEF DESCRIPTION OF THE DRAWINGS

FIG. 2 is a block diagram showing examples of functions realized by a processor and a second controller according to the first embodiment.

FIG. 3 is a block diagram showing an example of data stored in a volatile memory and a memory provided in a nonvolatile memory according to the first embodiment.

FIG. 5 is a cross-sectional view showing an example of a memory cell.

FIG. 6 is a graph showing an example of the relationship between an erase voltage application process and an erase verification process.

FIG. 9 are graphs showing an example of the relationship between distribution of threshold voltage of memory cells and increase in erase verification voltage.

FIG. 10 is a graph showing an example of the relationship between an iteration count indicated by verification voltage pattern data and erase verification voltage.

FIG. 11 is a graph showing an example of the relationship between an iteration count and erase verification voltage when erase verification voltage is increased by one step.

FIG. 12 is a graph showing a first example of the relationship between an iteration count and erase verification voltage when start erase verification voltage is used.

FIG. 13 is a graph showing an example of the relationship between an iteration count and erase verification voltage when erase verification voltage is increased by one step from start erase verification voltage.

FIG. 14 is a graph showing a second example of the relationship between an iteration count and erase verification voltage when start erase verification voltage is used.

FIG. 17 is a block diagram showing an example of a configuration of a memory system according to a third embodiment.

DETAILED DESCRIPTION

Various embodiments will be described hereinafter with reference to the accompanying drawings. In the following explanation, nearly or substantially the same functions and structural elements are denoted by like reference numbers. The explanation thereof is given depending on the need.

In general, according to one embodiment, a memory system includes a nonvolatile memory and a controller. The controller controls to the nonvolatile memory. The controller is configured to repeatedly perform an erase voltage application process for data stored in an erase target area in the nonvolatile memory, perform an erase verification process for determining whether the erase of the data is successful using erase verification voltage, the erase verification process corresponding to each of the repeatedly performed erase voltage application processes, change, when the erase of the data is not successful in the erase verification process, the erase verification voltage to new erase verification voltage to be used in a next erase verification process, determine, when the erase of the data is successful, whether an erase time is longer than a first threshold value, the erase time being a time that the controller takes to determine that the erase of the data in the erase target area is successful, and set the erase target area to a use prohibition state when the erase time is longer than the first threshold value.

[First Embodiment]

In the present embodiment, a memory system performs data erase control for realizing the expansion of the life of a nonvolatile memory.

In the present embodiment, as an example of the nonvolatile memory, a NAND flash memory is explained. However, the nonvolatile memory may be another type of memory which erases data stored in areas for each area. More specifically, the nonvolatile memory may be, for example, a NOR flash memory, a magnetoresistive random access memory (MRAM), a phase change random access memory (PRAM), a resistive random access memory (ReRAM) or a ferroelectric random access memory (FeRAM).

In the present embodiment, a process for applying erase voltage for erasing data to an erase target area of the nonvolatile memory is referred to as an erase voltage application process. In the present embodiment, the unit of the erase target area may be a block.

Figure 1:
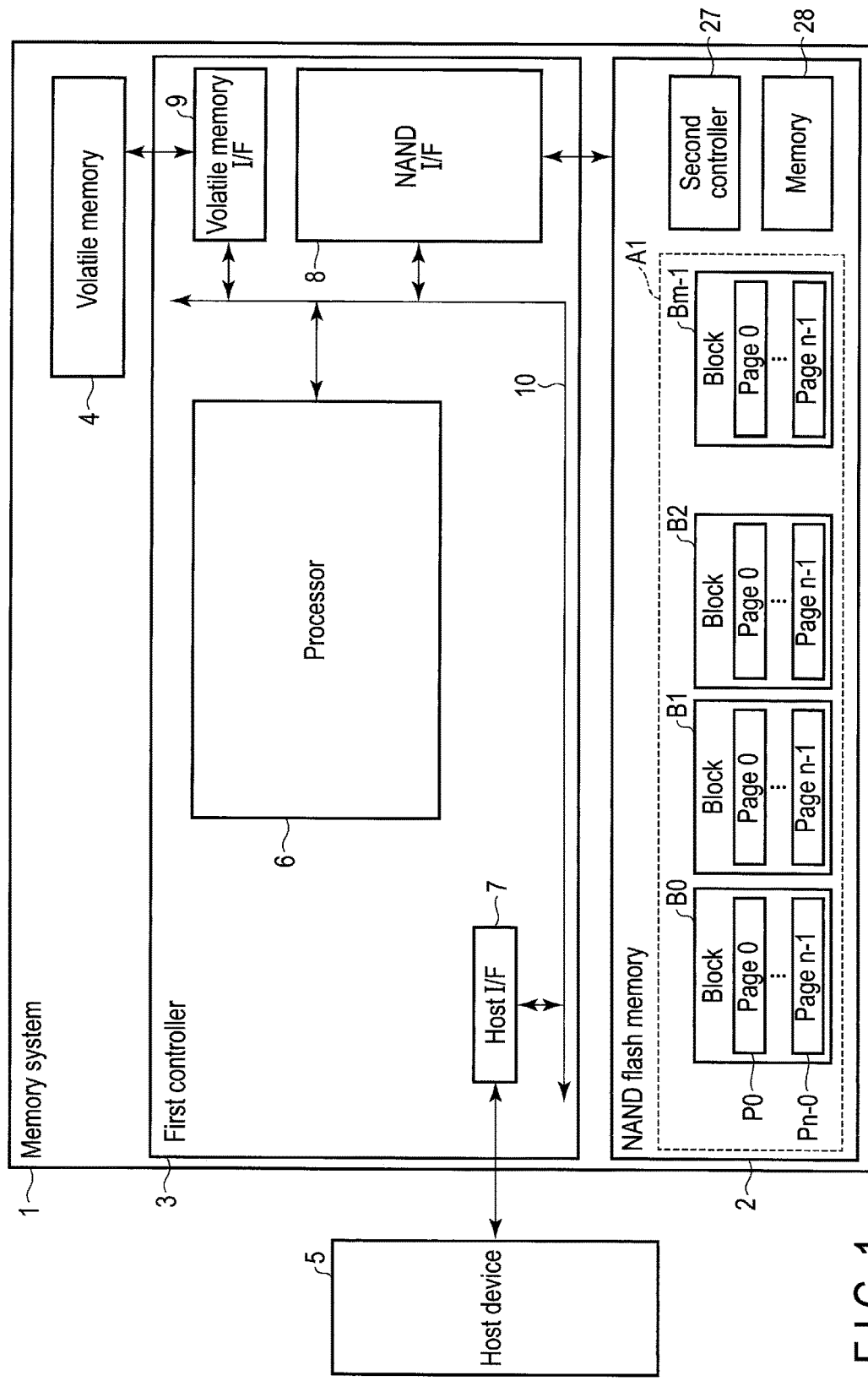
FIG. 1 is a block diagram showing an example of a memory system according to a first embodiment.

FIG. 1 is a block diagram showing an example of a memory system 1 according to the present embodiment. In the example of FIG. 1, the memory system 1 is a solid-state drive (SSD). However, the memory system 1 may be a device different from an SSD, such as a memory card. In FIG. 1, only the structural elements related to data erase for an erase target block and its verification are shown, and the other structural elements are omitted.

FIG. 2 is a block diagram showing examples of functions realized by a processor 6 and a second controller 27 according to the present embodiment. In FIG. 2, the second controller 27 realizes an erase unit 19 and a verification unit 20. The processor 6 functions as a first determination unit 22, a change unit 23, a second determination unit 24, a setting unit 25 and a prohibition unit 26. The layout of these structures can be freely changed.

FIG. 3 is a block diagram showing an example of data stored in a volatile memory 4 and a memory 28 provided in an NAND flash memory 2 according to the present embodiment. In FIG. 3, the memory 28 provided in the NAND flash memory 2 stores iteration count data 12, verification result data 14 and fail bit count data 15. The volatile memory 4 stores a control program 11, verification voltage pattern data 38, verification voltage data 13, erase time data 16, defective block data 17 and address translation data 18. The data layout can be freely changed.

In FIG. 1, the memory system 1 includes the NAND flash memory 2, a first controller 3 and the volatile memory 4. The NAND flash memory 2 includes a memory cell array A1, the second controller (for example, a sequencer) 27 and the memory 28. The memory system 1 is connected to a host device 5 accessing the memory system 1.

In the present embodiment, in data erase for the NAND flash memory 2, the memory system 1 changes, in a stepwise manner, the erase verification voltage used to determine whether erase of data in the erase target block is successful based on the iteration count data 11, the verification voltage pattern data 38 and the verification voltage data 13. In an erase verification process, erase verification voltage is applied to all of the word lines of a target block for the erase verification process. The number of bit lines in which current does not flow is counted. The number of bit lines in which current does not flow is the fail bit count. The fail bit count is more specifically explained later with reference to FIG. 7 to FIG. 9.

In the present embodiment, an increase in erase verification voltage indicates that the erase verification voltage is changed to make it unlikely to determine that data erase is successful in an erase verification process. Thus, when it is unlikely to determine that data erase is successful in the erase verification process by shifting the erase verification voltage in a minus direction, the increase in the erase verification voltage also includes the shifting of the erase verification voltage in the minus direction.

In the present embodiment, the increase in erase voltage indicates that erase voltage is changed in a direction for accelerating data erase in the erase voltage application process. More specifically, the increase in erase voltage indicates that the absolute value of the voltage applied between a semiconductor substrate and a control gate is increased in a stepwise manner to erase more data in the erase voltage application process.

Now, this specification gives an outline of the memory system 1 of the present embodiment in comparison with an erase operation of a comparison example.

In the erase operation of the comparison example, an erase voltage application process and an erase verification process corresponding to the erase voltage application process are repeated for the erase target block. When the iteration count of this loop exceeds a threshold indicating an upper limit (hereinafter, referred to as the threshold of the comparison example), the use of the erase target block will be prohibited. Blocks in a use prohibition state are called defective blocks.

The memory system 1 of the present embodiment repeats an erase voltage application process and an erase verification process for the erase target block, and increases the erase verification voltage used in an erase verification process (in other words, the memory system 1 makes it unlikely to determine that data erase is successful in the erase verification process) in accordance with the repetitive erase voltage application process.

When the iteration count of the erase voltage application process (which may be another kind of count, for example, an execution count of the erase voltage application process) for the erase target block exceeds an iteration count threshold (a fifth threshold) indicating the upper limit, the memory system 1 of the present embodiment stops repeating the erase voltage application process for the erase target block. The iteration count threshold used in the present embodiment is set to a value greater than the threshold of the comparison example explained above.

Thus, in the present embodiment, data erase for the erase target block is accelerated in comparison with the erase operation of the comparison example.

In the present embodiment, when the erase time required to complete data erase for the erase target block from start (for example, tBERASE) exceeds an erase time threshold (a first threshold), the erase target block is set to a defective block.

In the present embodiment, when the iteration count is less than or equal to the iteration count threshold greater than the threshold of the comparison example, an erase target block in which tBERASE is less than or equal to the erase time threshold can be continuously and actively used. Thus, it is possible to prevent an excessive increase in the number of defective blocks. In this way, the life of the memory system 1 can be increased.

Now, this specification explains each structural element shown in FIG. 1 to FIG. 3.

The host device 5 may be either a storage server (server) configured to store a large amount of various types of data in the memory system 1 or a personal computer. The memory system 1 may be used as a main storage of the host device 5. The memory system 1 may be provided in the host device 5, or may be connected to the host device 5 via a network.

The host device 5 transmits a write command to the memory system 1 when data is to be written to the memory system 1. The host device 5 transmits a read command to the memory system 1 when data is to be read from the memory system 1.

The NAND flash memory 2 includes a memory cell array A1. The memory cell array A1 includes a plurality of memory cells provided in matrix. The NAND flash memory 2 may be either a NAND flash memory having a two-dimensional structure or a NAND flash memory having a three-dimensional structure. The memory cell array A1 includes a plurality of physical blocks B0 to Bm−1. Each of physical blocks B0 to Bm−1 includes a plurality of pages (here, pages P0 to Pn−1). Each of physical blocks B0 to Bm−1 functions as the minimum erase unit which can specify an address. Each physical block may be referred to as an erase block or a physical erase block, or may be simply referred to as a block as described above. Each of pages P0 to Pn−1 includes a plurality of memory cells connected to the same word line. Each of pages P0 to Pn−1 is unit of data write operation and data read operation. The detailed structures of the memory cell array A1 and each memory cell are explained later with reference to FIG. 4 and FIG. 5.

The second controller 27 included in the NAND flash memory 2 functions as the erase unit 19 and the verification unit 20 as shown in FIG. 2. The second controller 27 may be an integral structure as shown in FIG. 1, or may be realized by a plurality of dedicated circuits.

The memory 28 included in the NAND flash memory 2 stores the iteration count data 12, the verification result data 14 and the fail bit count data 15 as shown in FIG. 3. For example, a register or volatile memory is used for the memory 28. However, the memory 28 is not limited to these examples. Various volatile or nonvolatile memories may be used as the memory 28. The memory 28 may be included in the second controller 27. Alternatively, part of the memory cell array A1 may be used for the memory 28.

The first controller 3 includes, as shown in FIG. 1, the processor 6, a host interface 7, a NAND interface 8 and a volatile memory interface 9. The processor 6, the host interface 7, the NAND interface 8 and the volatile memory interface 9 may be connected to each other via a bus 10.

The processor 6 receives various commands (for example, a write command and a read command) from the host device 5 via the host interface 7. The processor 6 transmits data (for example, read data and error information) to the host device 5 via the host interface 7. For example, a central processing unit (CPU) or a microprocessor unit (MPU) may be used for the processor 6.

When the processor 6 receives a write command from the host device 5 via the host interface 7 and the bus 10, the processor 6 writes data to the NAND flash memory 2 via the bus 10 and the NAND interface 8 based on the write command.

When the processor 6 receives a read command from the host device 5 via the host interface 7 and the bus 10, the processor 6 reads data from the NAND flash memory 2 via the NAND interface 8 and the bus 10 based on the read command, and transmits the read data to the host device 5 via the bus 10 and the host interface 7.

When a free block which does not store valid data is generated as a result of data overwriting in accordance with a write command from the host device 5, garbage collection, refreshing, wear leveling, etc., the processor 6 erases the data (invalid data) in the free block to generate a new write destination block.

The processor 6 is capable of writing data to the volatile memory 4 and reading data from the volatile memory 4 via the volatile memory interface 9 and the bus 10.

To simplify explanation, the host interface 7, the NAND interface 8, the volatile memory interface 9 and the bus 10 are omitted in the following description. When the memory system 1 is turned on, the processor 6 reads the control program (firmware) 11, the verification voltage pattern data 38, the verification voltage data 13, the defective block data 17 and the address translation data 18 stored in the NAND flash memory 2, and stores these read data in the volatile memory 4. Before the memory system 1 is turned off, the processor 6 writes the verification voltage data 13, the defective block data 17 and the address translation data 18 stored in the volatile memory 4 to the NAND flash memory 2. The erase time data 16 may be also read from the NAND flash memory 2 when the memory system 1 is turned on, and the read erase time data 16 may be written to the NAND flash memory 2 before the memory system 1 is turned off.

For example, the processor 6 functions as the first determination unit 22, the change unit 23, the second determination unit 24, the setting unit 25 and the prohibition unit 26 by executing the control program 11 as shown in FIG. 2. At least one of the first determination unit 22, the change unit 23, the second determination unit 24, the setting unit 25 and the prohibition unit 26 realized by executing the control program by the processor 6 may be realized by dedicated hardware, and/or may be provided in the first controller 3 as a separate structure from the processor 6.

In the present embodiment, the erase unit 19 and the verification unit 20 realized by the second controller 27 and the first determination unit 22, the change unit 23, the second determination unit 24, the setting unit 25 and the prohibition unit 26 realized by the processor 6 can operate in cooperation with each other.

In the present embodiment, the volatile memory 4 stores, as shown in FIG. 3, the control program 11, the verification voltage pattern data 38, the verification voltage data 13, the erase time data 16, the defective block data 17 and the address translation data 18.

The iteration count data 12 associates block identifier indicating the erase target block with the iteration count of the erase voltage application process executed for the erase target block.

The verification voltage pattern data 38 includes the relationship between the iteration count at which the erase verification voltage should be increased and corresponding voltage. The verification voltage pattern data 38 is explained in detail later with reference to FIG. 10.

The verification voltage data 13 associates block identifier indicating each block included in the NAND flash memory 2 with start erase verification voltage for the block indicated by the block identifier. Start erase verification voltage is erase verification voltage used in the erase verification process corresponding to the erase voltage application process performed at the time of starting the erase operation for the erase target block. Start erase verification voltage may have a default value before it is updated by the setting unit 25.

The verification result data 14 associates block identifier indicating the erase target block with data indicating the result (pass [success] or fail [failure]) of the erase verification process for the erase target block.

For example, the fail bit count data 15 associates block identifier indicating the erase target block with the fail bit count for the erase target block.

The erase time data 16 associates block identifier indicating the erase target block with tBERASE for the erase target block.

The defective block data 17 includes defective block identifier (for example, a logical address or physical address) indicating each defective block among the blocks included in the NAND flash memory 2.

The address translation data 18 is, for example, the data used to translate the logical address received from the host device 5 into the physical address of the NAND flash memory 2.

The data 12 to 17 explained above may be freely divided or combined for management. For example, data in which the iteration count, the pass/fail of an erase verification process, start erase verification voltage, the fail bit count, tBERASE and data indicating whether or not the block is a defective block are associated with block identifier may be used in the memory system 1.

Of the various types of data explained above, the iteration count data 12, the verification result data 14, the fail bit count data 15 and the erase time data 16 may include data related only to each erase target block in which erase operation is performed. Thus, in comparison with a case where the iteration count data 12, the verification result data 14, the fail bit count data 15 and the erase time data 16 include data related to all of blocks B0 to Bm-1, the required memory capacity can be less because data necessary only for erase operation are stored in the volatile memory 4 or the memory 28. The verification voltage data 13 may include start erase verification voltage related to all of blocks B0 to Bm-1.

The erase unit 19 performs the erase voltage application process for the erase target block. Further, in the present embodiment, the erase unit 19 manages the iteration count of the erase voltage application process performed in erase operation, using the iteration count data 12. The erase unit 19 has the iteration count threshold indicating the upper limit of the iteration count. When the iteration count of the erase voltage application process for the erase target block indicated by the iteration count data 12 exceeds the iteration count threshold, the erase unit 19 terminates the loop of the erase voltage application process. In this case, the prohibition unit 26 adds the block identifier of the erase target block to the defective block data 17, and sets the erase target block to a defective block.

The erase voltage used by the erase unit 19 to erase data may be changed in accordance with the iteration count. For example, the erase unit 19 may change (for example, increase) the erase voltage such that data erase for the erase target block is accelerated as the iteration count is increased.

Alternatively, the erase unit 19 may perform the erase voltage application process with the same erase voltage regardless of the iteration count.

The verification unit 20 performs the erase verification process for determining the pass/fail of data erase for the erase target block, using the start erase verification voltage indicated by the verification voltage data 13 or the erase verification voltage changed by the change unit 23.

In the present embodiment, for example, the verification unit 20 compares start erase verification voltage with the erase verification voltage changed by the change unit 23, selects higher erase verification voltage, and performs the erase verification process using the selected erase verification voltage. In other words, the verification unit 20 performs the erase verification process, using, of the start erase verification voltage stored in the verification voltage data 13 and the erase verification voltage changed by the change unit 23, the erase verification voltage which makes it unlikely to determine the data erase as pass in the erase verification process.

The erase verification voltage used by the verification unit 20 in the erase verification process is explained in detail later with reference to FIG. 7 to FIG. 9.

In the erase verification process, the verification unit 20 counts the fail bit in the erase target block, using the start erase verification voltage stored in the verification voltage data 13 or the erase verification voltage changed by the change unit 23. The verification unit 20 stores, in the fail bit count data 15, the fail bit count of the erase target block associated with the block identifier indicating the erase target block.

Subsequently, when the fail bit count of the erase target block is less than or equal to the verification fail bit count threshold set for determining the pass/fail of an erase verification process, the verification unit 20 determines the erase verification process as pass. When the fail bit count exceeds the verification fail bit count threshold, the verification unit 20 determines the erase verification process as fail. The verification unit 20 stores, in the verification result data 14, the result of determination indicating the pass or fail of the erase verification process for the erase target block associated with the block identifier indicating the erase target block.

When the erase verification process is determined as fail, the verification unit 20 transmits the fail bit count data 15 to the first determination unit 22 of the first controller 3. When the erase verification process is determined as pass, the verification unit 20 transmits verification result data 14 indicating pass to the second determination unit 24 of the first controller 3.

The relationship between the erase voltage application process performed by the erase unit 19 and the erase verification process performed by the verification unit 20 is explained in detail later with reference to FIG. 6.

The first determination unit 22 determines, based on the fail bit count of the erase target block indicated by the fail bit count data 15 received from the verification unit 20, whether the fail bit count of the erase target block exceeds a change threshold (a second threshold) determined based on a range in which the change in erase verification voltage is permitted.

The change unit 23 changes the erase verification voltage used for the erase target block by the verification unit 20 based on the iteration count data 12 and the verification voltage pattern data 38 when the fail bit count of the erase target block exceeds the change threshold. In the present embodiment, for example, the change unit 23 increases the verification voltage when the fail bit count of the erase target block exceeds the change threshold, and further when the iteration count of the erase voltage application process is the iteration count at which the erase verification voltage should be increased. When the erase verification voltage is increased, data erase is unlikely determined as pass in the erase verification process.

When the fail bit count of the erase target block is less than or equal to the change threshold, or when the erase verification voltage is changed by the change unit 23, the erase unit 19 increments the iteration count of the erase voltage application process for the erase target block, updates the iteration count data 12 by associating the incremented iteration count with the block identifier of the erase target block, and repeats the erase voltage application process.

When the second determination unit 24 receives verification result data 14 indicating pass from the verification unit 20, the second determination unit 24 obtains tBERASE of the erase target block and stores, in the erase time data 16, the obtained as tBERASE associated with the block identifier indicating the erase target block. The second determination unit 24 determines whether the erase target block should be set to a defective block by determining whether the tBERASE of the erase target block exceeds the erase time threshold based on the erase time data 16.

When the second determination unit 24 determines that the erase target block should not be set to the defective block, the setting unit 25 sets the latest erase verification voltage used in the erase verification process in which data erase is determined as pass to the start erase verification voltage to be initially used in the next erase operation for the erase target block, and stores, in the verification voltage data 13, the start erase verification voltage associated with the block identifier indicating the erase target block.

When the second determination unit 24 determines that the erase target block should be set to the defective block, the prohibition unit 26 updates the defective block data 17 such that block identifier indicating the erase target block is included in the defective block data 17, and sets the erase target block to the defective block.

The verification of the fail bit count threshold, the iteration count threshold, the erase time threshold, the change threshold, the pattern of the erase voltage applied by the erase unit 19 and the increase pattern of the erase verification voltage stored in the verification voltage pattern data 38 in the present embodiment can be freely set in accordance with, for example, the actual measurement values, theoretical values, statistical values, error rate and processing time.

Figure 4:
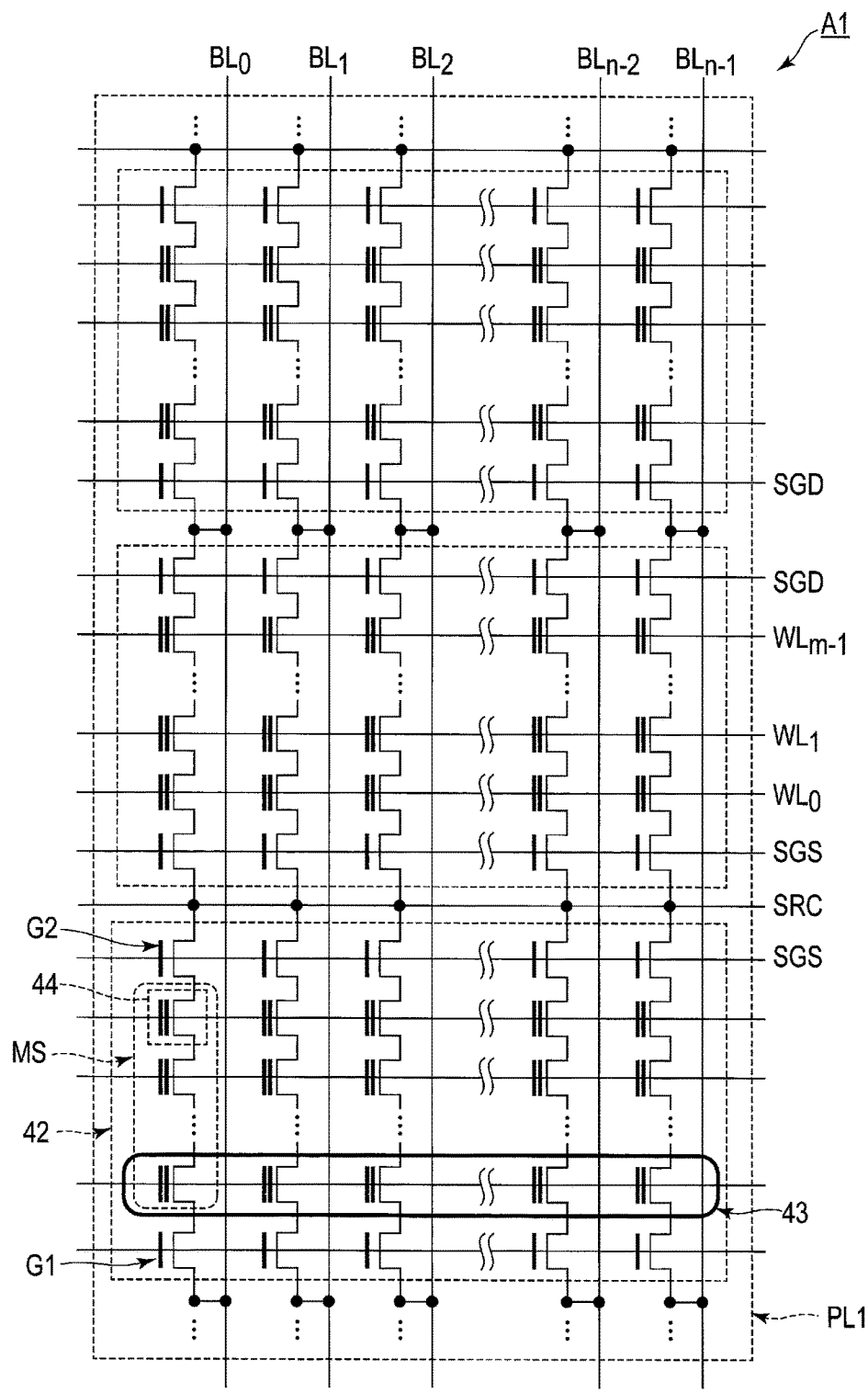
FIG. 4 is a circuit diagram showing an example of a structure of a memory cell array.

FIG. 4 is a circuit diagram showing an example of a structure of the memory cell array A1.

In the memory cell array A1, a plurality of memory cells 44 are arranged in matrix. The memory cell array A1 includes a plurality of NAND cells. Each NAND cell includes a memory string MS including the memory cells 44 connected in series, and select gates G1 and G2 connected to both ends of the memory string MS. Select gate G1 is connected to bit lines $BL_0$ to $BL_{n-1}$. Select gate G2 is connected to a source line SRC. The control gates of the memory cells 44 arranged in the same row are connected to word lines $WL_0$ to $WL_{m-1}$ in common. The first select gate G1 is connected to a select line SGD in common. The second select gate G2 is connected to a select line SGS in common.

The memory cell array A1 includes one or more planes PL1. Each plane PL1 includes a plurality of blocks 42. Each block 42 includes a plurality of NAND cells, and is the unit of data erase.

The memory cells 44 connected to a single word line constitute a single memory cell group 43 as physical sectors. When each memory cell 44 stores one bit (binary data), a single memory cell group 43 corresponds to one page. When each memory cell 44 stores two or more bits (multivalued data), a single memory cell group 43 corresponds to a plurality of pages. In NAND flash memories, data writing and reading are performed for each page. In read operation, program verification operation or program operation, a single word line and a single page are selected in accordance with the physical address received from the controller 3. The page is switched by a physical address.

FIG. 5 is a cross-sectional view showing an example of each memory cell 44. The memory cell 44 is a memory cell transistor. For example, an N-well 31*n* is formed on a P-type substrate 30. In the N-well 31*n*, a P-well 31*p* is formed. A drain 32 and a source 33 are formed away from each other in the P-well 31*p*. A floating gate 35 is formed over the area between the drain 32 and the source 33 via an insulating layer 34. Over the floating gate 35, a control gate 37 is formed via an insulating layer 36. A word line WL is connected to the control gate 37. In an erase voltage application process, voltage higher than that of the word line WL is applied to the P-well 31*p*. In this way, the electrons in the floating gate 35 move to the P-well 31*p* side. Thus, the memory cell 44 is set to an erase state. In the case of normal positive sensing operation, in an erase verification process, the erase verification voltage is applied to the word line WL, and for example, 0 V is applied to the source line SRC and the P-well 31*p*. In case of negative sensing operation (when negative read voltage is applied), for example, voltage of approximately 0 V is applied to the word line WL, and voltage corresponding to the erase verification voltage, for example, voltage of approximately 1 V, is applied to the source line SRC and the P-well 31*p*.

As explained in FIG. 5, in the present embodiment, the application of voltage to the P-well 31*p* may be expressed as the application of voltage to the substrate. When this specification uses the expression "application of voltage to the substrate", the substrate indicates the area of a back gate (bulk) of the memory cell transistor and indicates the P-well 31*p* instead of the substrate 30 of FIG. 5.

FIG. 6 is a graph showing an example of the relationship between an erase voltage application process and an erase verification process. In FIG. 6, the horizontal axis represents time, and the vertical axis represents voltage. In the explanation of FIG. 6, the application of erase verification voltage is not for the negative sensing. In FIG. 6, erase voltages Vera1, Vera2 and Vera3 and erase verification voltages Vevfy1, Vevfy2 and Vevfy3 are indicated by absolute values excluding the polarity. In the following description, similarly, erase voltages Vera1, Vera2 and Vera3 and erase verification voltages Vevfy1, Vevfy2 and Vevfy3 are explained with absolute values excluding the polarity. FIG. 6 exemplarily shows the case of positive sensing with respect to erase verification voltages Vevfy1, Vevfy2 and Vevfy3. In this case, the increase in erase verification voltages Vevfy1, Vevfy2 and Vevfy3 indicates the change in erase verification voltage in a direction in which the pass of the erase verification process is unlikely. Thus, the erase verification voltages shown in FIG. 6 have the relationship of Vevfy1>Vevfy2>Vevfy3. FIG. 6 shows three erase voltage application processes EA1, EA2 and EA3, and three erase verification voltage application processes EP1, EP2 and EP3 and fail bit counting processes FC1, FC2 and FC3 corresponding to the erase voltage application processes EA1, EA2 and EA3, respectively.

In FIG. 6, erase voltage application process EA1, erase verification voltage application process EP1 and fail bit counting process FC1 are performed in iteration 1. Erase voltage application process EA2, erase verification voltage application process EP2 and fail bit counting process FC2 are performed in iteration 2. Erase voltage application process EA3, erase verification voltage application process EP3 and fail bit counting process FC3 are performed in iteration 3.

When erase voltage application processes EA1, EA2 and EA3 are performed by the erase unit 19, voltage VSS (for example, 0 V) is applied to all the word lines connected to the memory cells included in the erase target block.

The erase unit 19 performs the first erase voltage application process EA1. Erase voltage Vera1 is increased in a stepwise manner in the first erase voltage application process EA1. The erase voltage is, for example, the voltage applied to the substrate of the NAND flash memory 2. Specifically, data erase for the erase target block is performed by applying VSS to all the word lines of the erase target block (selected block), setting all the word lines of each block which is not the erase target block (i.e., nonselected block) to a floating state, and applying erase voltage to the substrate in which a plurality of blocks B0 to Bm−1 are arranged.

After the completion of the first erase voltage application process EA1, the verification unit 20 performs the first erase verification voltage application process EP1 and performs the first fail bit counting process FC1. As described above, in the erase verification process, erase verification voltage Vevfy1 is applied to all the word lines of the target block of the erase verification process. The number of bit lines in which current does not flow is counted, and is obtained as the fail bit count. In the erase verification process, when the fail bit count is less than or equal to the verification fail bit count threshold set to determine the pass/fail of the erase verification process, data erase is determined as pass. When the fail bit count exceeds the verification fail bit count threshold, data erase is determined as fail.

When the result of the first erase verification process EP1 indicates fail, the erase unit 19 performs the second erase voltage application process EA2. Erase voltage Vera2 applied in the second erase voltage application process EA2 is increased to be greater than the erase voltage Vera1 applied in the first erase voltage application process EA1. As described above, an increase in erase voltage indicates that erase voltage is changed in a direction in which data erase is accelerated in the erase voltage application process.

After the completion of the second erase voltage application process EA2, the verification unit 20 performs the second erase verification voltage application process EP2, using erase verification voltage Vevfy2. The verification unit 20 performs the second fail bit counting process FC2.

When the result of the second erase verification voltage application process EP2 indicates fail, the erase unit 19 performs the third erase voltage application process EA3. Erase voltage Vera3 applied in the third erase voltage application process EA3 is increased to be greater than the erase voltage Vera2 applied in the second erase voltage application process EA2.

After the completion of the third erase voltage application process EA3, the verification unit 20 performs the third erase verification voltage application process EP3, using erase verification voltage Vevfy3. The verification unit 20 performs the fail bit counting process FC3.

Figure 7:
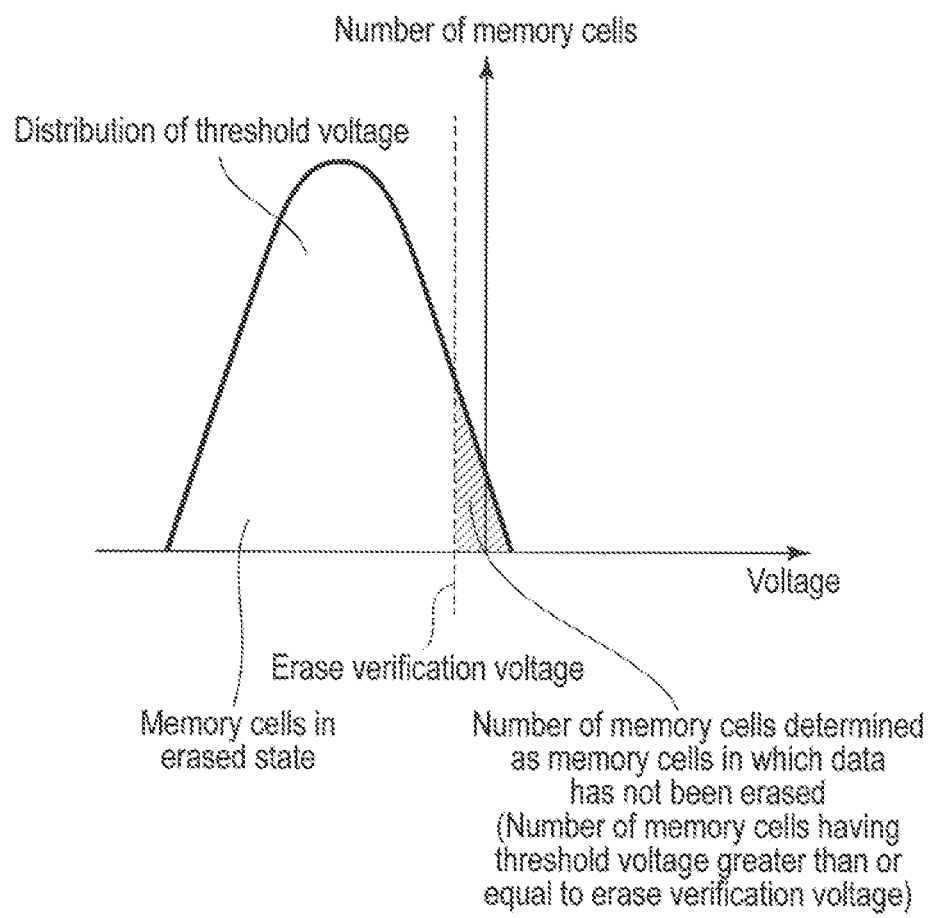
FIG. 7 is a graph showing an example of the relationship of distribution of threshold voltage of memory cells, erase verification voltage and a fail bit count.
Figure 8:
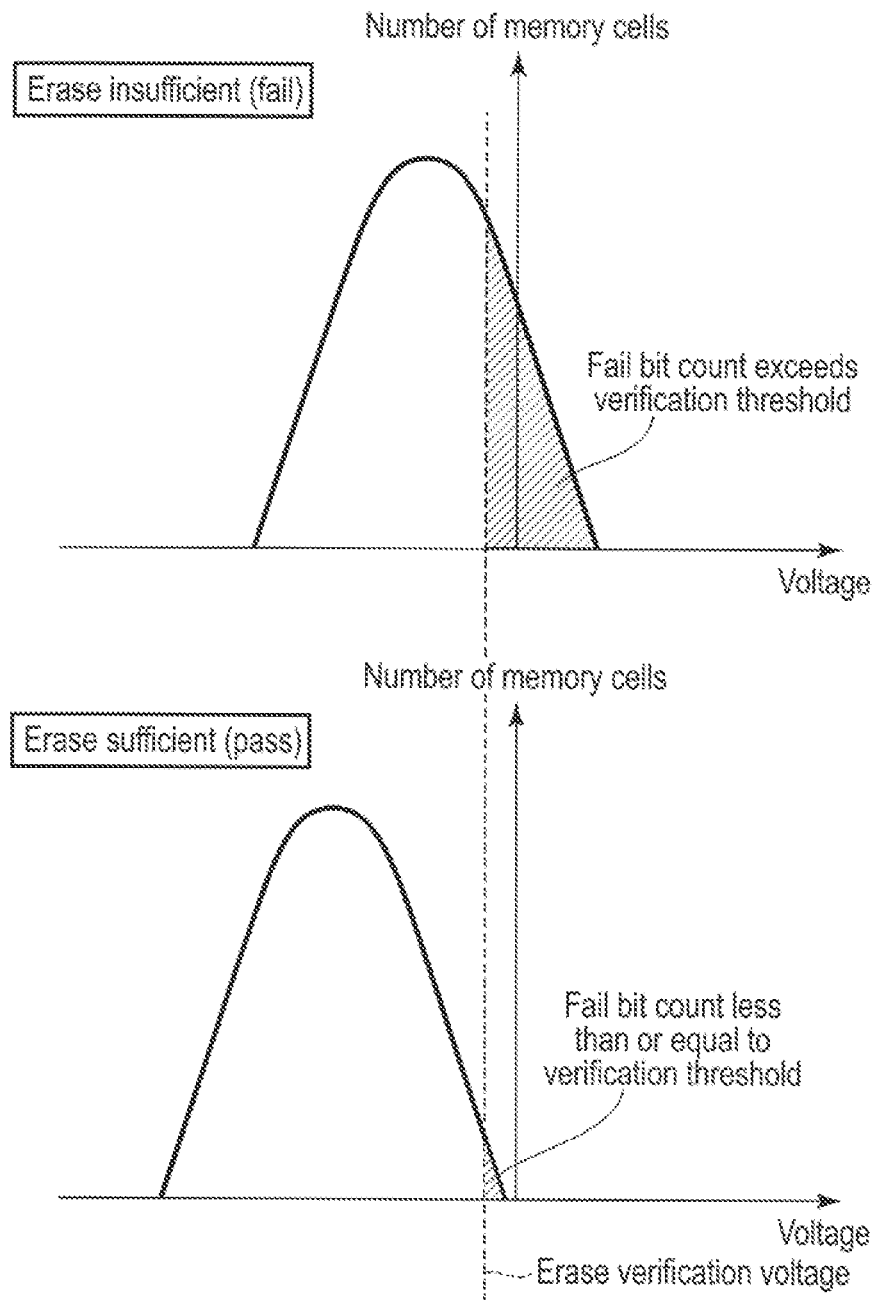
FIG. 8 are graphs showing an example for comparing distribution of threshold voltage when data erase is determined as fail (insufficient) with as pass (sufficient) in an erase verification process.

Now, this specification explains the relationship between the increase in erase verification voltage and the fail bit count with reference to FIG. 7 to FIG. 9.

FIG. 7 is a graph showing an example of the relationship of distribution of the threshold voltage of the memory cells 44, the erase verification voltage and the fail bit count. In FIG. 7, the horizontal axis represents voltage, and the vertical axis represents the number of memory cells.

In the distribution of threshold voltage, the number of memory cells having threshold voltage greater than or equal to the erase verification voltage corresponds to the number of memory cells determined as memory cells in which data has not been erased. As described above, the fail bit count counted in the erase verification process is the number of bit lines in which at least one memory cell having threshold voltage greater than or equal to the erase verification voltage is present.

FIG. 8 are graphs showing an example for comparing distribution of threshold voltage when data erase is determined as fail (insufficient) with as pass (sufficient) in the erase verification process.

When the fail bit count counted in the erase verification process using the erase verification voltage exceeds the verification fail bit count threshold for the pass/fail determination used in the erase verification process, data erase is determined as fail in the erase verification process.

When the fail bit count counted in the erase verification process using the erase verification voltage is less than or equal to the verification fail bit count threshold, data erase is determined as pass in the erase verification process.

FIG. 9 are graphs showing an example of the relationship between distribution of threshold voltage of the memory cells 44 and the increase in the erase verification voltage.

When the erase verification voltage is increased, the erase verification voltage is shifted to the minus side from the erase verification voltage before the increase.

Even with the distribution of threshold voltage, in which the result of the erase verification process using the erase verification voltage before the increase indicates pass, the result of the erase verification process may be determined as fail when using the erase verification voltage after the increase.

With the distribution of threshold voltage in which an erase state is sufficient, the result of the erase verification process is determined as pass even in the erase verification process using the erase verification voltage after the increase.

FIG. 10 is a graph showing an example of the relationship between the iteration count indicated by the verification voltage pattern data 38 and the erase verification voltage. In FIG. 10, the horizontal axis represents the iteration count, and the vertical axis represents the erase verification voltage.

In the verification voltage pattern data 38, default erase verification voltage Vdef is assigned for the first iteration. When the iteration count has reached a predetermined value, the erase verification voltage is increased. The iteration count at which the erase verification voltage is increased can be freely changed. The level of the increase can also be freely changed. In the present embodiment, the erase verification voltage is changed in a stepwise manner in accordance with the increase in the iteration count.

FIG. 11 is a graph showing an example of the relationship between the iteration count and the erase verification voltage when the erase verification voltage is increased by one step.

In FIG. 11, the iteration count exceeds the count at which the erase verification voltage should be increased. Thus, the erase verification voltage is increased from Vdef to Vevfy_a. When the erase verification voltage is increased by one step, and further when data erase is determined as pass in the erase verification process, and further when the erase target block is not determined as a defective block, the erase verification voltage Vevfy_a after the increase is associated with the block identifier of the erase target block and is stored in the verification voltage data 13 as start erase verification voltage.

FIG. 12 is a graph showing a first example of the relationship between the iteration count and the erase verification voltage when the start erase verification voltage is used.

When the start erase verification voltage stored in the verification voltage data 13 is greater than the erase verification voltage obtained from the verification voltage pattern data 38, the start erase verification voltage is prioritized. In the example of FIG. 12, when erase operation is started, since the start erase verification voltage Vevfy_a stored in the verification voltage data 13 is greater than the erase verification voltage Vdef obtained from the verification voltage pattern data 38, the erase verification process using the start erase verification voltage Vevfy_a is performed in the first iteration.

In FIG. 12, data erase is determined as pass in the erase verification process before the start erase verification voltage Vevfy_a is updated. Thus, the start erase verification voltage Vevfy_a stored in the verification voltage data 13 is maintained as it is.

FIG. 13 is a graph showing an example of the relationship between the iteration count and the erase verification voltage when the erase verification voltage is increased by one step from the start erase verification voltage.

After erase operation is started, data erase is not determined as pass in the erase verification process using the start erase verification voltage Vevfy_a, and the iteration count is increased. Thus, erase verification voltage Vevfy_b obtained from the verification voltage pattern data 38 is greater than the start erase verification voltage Vevfy_a. In this case, in the subsequent erase verification processes, the erase verification voltage Vevfy_b obtained from the verification voltage pattern data 38 is used. The erase verification voltage Vevfy_b is greater than the start erase verification voltage Vevfy_a by one step. Thus, when data erase operation is determined as pass in the erase verification process, and further when the erase target block is not determined as a defective block, the erase verification voltage Vevfy_b after the increase is associated with the block identifier of the erase target block and is stored in the verification voltage data 13 as the start erase verification voltage.

FIG. 14 is a graph showing a second example of the relationship between the iteration count and the erase verification voltage when the start erase verification voltage is used.

In the example of FIG. 14, when erase operation is started, the erase verification process using the start erase verification voltage Vevfy_b is performed in the first iteration since the start erase verification voltage Vevfy_b stored in the verification voltage data 13 is greater than the erase verification voltage Vdef obtained from the verification voltage pattern data 38. In FIG. 14, data erase is determined as pass in the erase verification process before the start erase verification voltage Vevfy_b is updated. Thus, the start erase verification voltage Vevfy_b stored in the verification voltage data 13 is maintained as it is.

As explained above, in the present embodiment, when data erase operation is determined as pass by the verification unit 20 after the erase verification voltage is increased, and further when the second determination unit 24 determines that the erase target block should not be set to a defective block, the latest increased erase verification voltage corresponding to the erase target block is stored in the verification voltage data 13 as start erase verification voltage. Next time an erase verification process is performed for the same erase target block, the verification unit 20 uses the start erase verification voltage registered in the verification voltage data 13. The verification unit 20 performs the erase verification process, using the higher erase verification voltage of the start erase verification voltage and the erase verification voltage changed in a stepwise manner based on the verification voltage pattern data 38.

Figure 15:
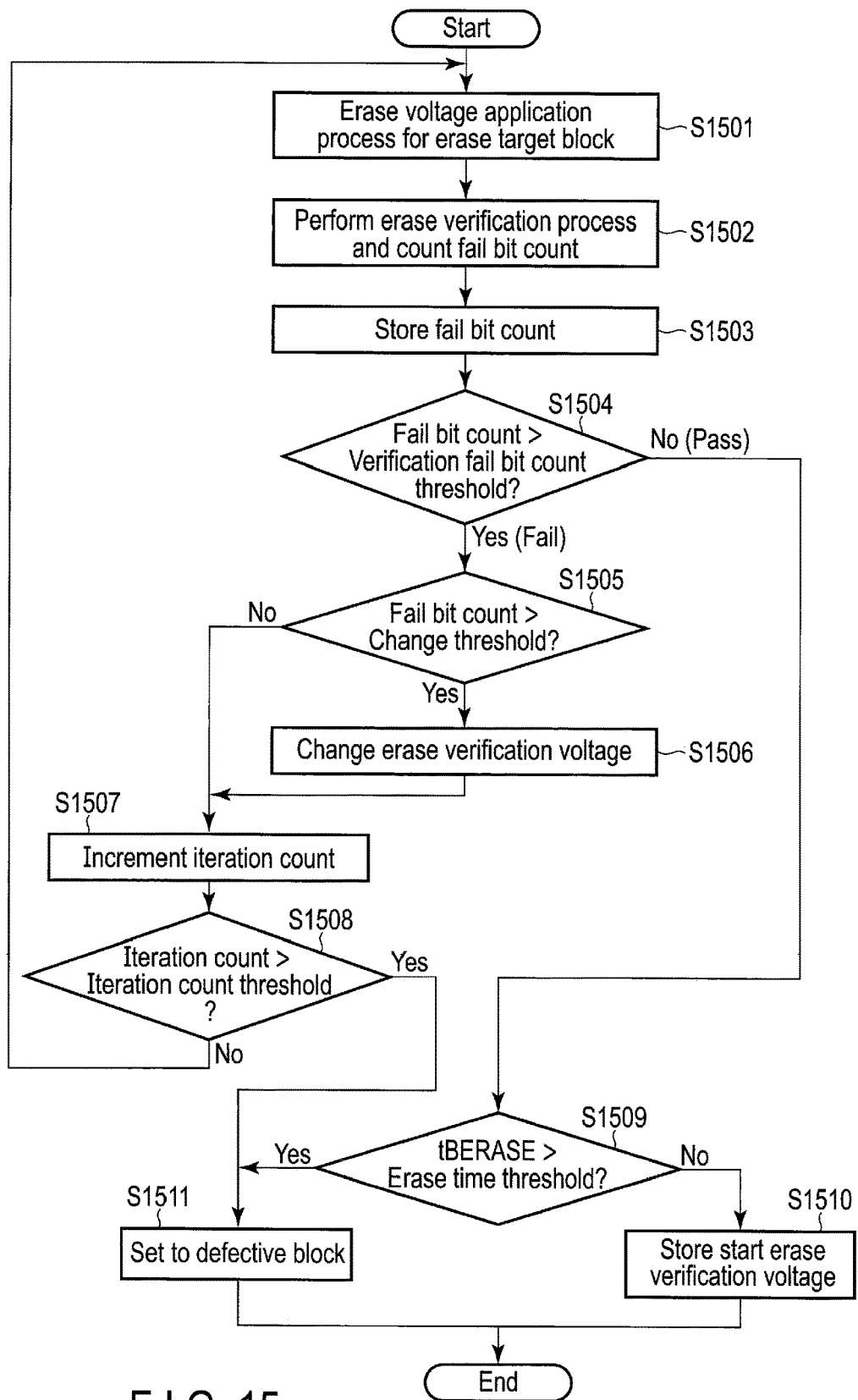
FIG. 15 is a flowchart showing an example of a data erase control process performed by the memory system according to the first embodiment.

FIG. 15 is a flowchart showing an example of the data erase control process performed by the memory system 1 according to the present embodiment.

In step S1501, the erase unit 19 performs the erase voltage application process for the erase target block.

In step S1502, the verification unit 20 performs sensing, using the start erase verification voltage indicated by the verification voltage data 13 or the erase verification voltage changed in step S1506 below. Based on the result of sensing, the verification unit 20 counts the fail bit count of the erase target block. More specifically, the verification unit 20 applies the erase verification voltage to all the word lines of the erase target block after the erase voltage application process, and counts the number of bit lines in which current does not flow as the fail bit count.

In step S1503, the verification unit 20 stores the fail bit count of the erase target block in the fail bit count data 15 by associating the fail bit count with the block identifier of the erase target block.

In step S1504, the verification unit 20 determines whether the fail bit count exceeds the verification fail bit count threshold set to determine the pass/fail of the erase verification process. When the fail bit count is less than or equal to the verification fail bit count threshold, data erase operation is determined as pass. The verification unit 20 transmits verification result data 14 indicating pass to the second determination unit 24. The process proceeds to step S1509.

When the fail bit count exceeds the verification fail bit count threshold, data erase operation is determined as fail. The verification unit 20 transmits the fail bit count data 15 to the first determination unit 22.

In step S1505, when the first determination unit 22 receives the fail bit count data 15 from the verification unit 20, the first determination unit 22 determines whether the fail bit count of the erase target block indicated by the fail bit count data 15 exceeds the change threshold used to determine whether the change in erase verification voltage is required.

When the fail bit count of the erase target block is less than or equal to the change threshold, the process proceeds to step S1507.

When the fail bit count of the erase target block exceeds the change threshold, in step S1506, the change unit 23 changes the erase verification voltage used for the erase target block in the verification unit 20 based on the iteration count data 12 and the verification voltage pattern data 38 explained in FIG. 10 above. In the present embodiment, for example, the change unit 23 increases the verification voltage to be used in the verification unit 20 when the iteration count of the erase voltage application process is the count at which the voltage should be increased. The process proceeds to step S1507.

In step S1507, the erase unit 19 increments the iteration count of the erase voltage application process for the erase target block and stores the incremented iteration count in the iteration count data 12 by associating the iteration count with the block identifier of the erase target block.

In step S1508, the erase unit 19 determines whether the iteration count corresponding to the erase target block exceeds the iteration count threshold indicating the upper limit of the iteration count based on the iteration count data 12. When the iteration count exceeds the iteration count threshold, the process proceeds to step S1511. When the iteration count is less than or equals to the iteration count threshold, the process proceeds to step S1501.

When the erase for the erase target block is determined as pass by the verification unit 20 in step S1504, the second determination unit 24 receives verification result data 14 indicating pass from the verification unit 20 in step S1509. When the second determination unit 24 receives the verification result data 14 indicating pass, the second determination unit 24 determines whether the erase target block should be set to a defective block by determining whether the tBERASE of the erase target block exceeds the erase time threshold.

When the tBERASE is less than or equals to the erase time threshold, the setting unit 25 stores the start erase verification voltage of the erase target block in the verification voltage data 13 such that the start erase verification voltage is set to the latest erase verification voltage changed by the change unit 23 in step S1510. In this manner, the start erase verification voltage used at the time of starting the next erase voltage application process for the erase target block is updated.

When the tBERASE exceeds the erase time threshold, or when the iteration count exceeds the iteration count threshold indicating the upper limit in step S1508, the prohibition unit 26 updates the defective block data 17 such that the erase target block is set to a defective block in step S1511.

Now, this specification explains effects obtained by the memory system 1 according to the present embodiment explained above.

For example, in NAND flash memories, the number of defective blocks is tend to increase when the cycle of a program and erase has reached a certain level. Further, in general, the erase verification voltage used in an erase verification process is fixed. In the erase operation of the comparison example explained above, the erase target block is set to a defective block when the iteration count of the erase target block exceeds the threshold of the comparison example indicating the upper limit of the iteration count. Since the threshold of the comparison example used in the erase operation of the comparison example is fixed, the result of determination regarding whether the erase target block should be set to the defective block is also fixed. For example, it is assumed that blocks A and B having two different types of fail bit count thresholds FBC_a and FBC_b, respectively, are provided in the erase operation of the comparison example in which the upper limit of the iteration count (the threshold of the comparison example) and the erase verification voltage are fixed. When the relationship of FBC_a<FBC_b is established in the fail bit counts of blocks A and B, and further when FBC_b−FBC_a=ΔFBC is sufficiently less, and further when the iteration count of block A does not exceeds the upper limit (the threshold of the comparison example), and further when the iteration count of block B exceeds the upper limit (the threshold of the comparison example), the characteristics of block B after the erase are substantially the same as those of block A. However, block B is registered as the defective block. This configuration is directly linked to an excessive increase in the number of defective blocks.

In the present embodiment, the erase verification voltage used in the erase verification process is increased (data erase is unlikely determined as pass in the erase verification process) in accordance with the increase in the iteration count of the erase voltage application process. The iteration count threshold indicating the upper limit of the iteration count of the erase voltage application process in the present embodiment is greater than the threshold of the comparison example. Thus, in the present embodiment, tBERASE is greater than that in the erase operation of the comparison example. In the present embodiment, when tBERASE exceeds the erase time threshold, the erase target block is determined as the defective block.

The memory system 1 of the present embodiment actively uses an erase target block of which tBERASE is less than or equals to the erase time threshold. Thus, it is possible to prevent an excessive increase in the number of defective blocks and the decrease in the storage capacity of the NAND flash memory 2. In this way, in the present embodiment, the life of the memory system 1 can be increased.

In the present embodiment, whether the erase target block should be set to the defective block is determined using tBERASE. For example, even a block determined as the defective block in the erase operation of the comparison example because the iteration count exceeds the threshold of the comparison example is not determined as the defective block in the present embodiment when tBERASE is less than or equal to the erase time threshold. Thus, such a block may be continuously used in the present embodiment. In this manner, in the present embodiment, it is possible to prevent the decrease in the number of usable blocks in comparison with the erase operation of the comparison example.

In the present embodiment, even a block of which erase is determined as pass in the erase verification process is determined as a defective block when tBERASE exceeds the erase time threshold. Thus, in the present embodiment, it is possible to prevent use of a block that takes a long time to complete erasing. In a block having a long tBERASE, the memory cells included in the block have degraded. Thus, the bit error rate tends to be high. The reliability of a memory system continuously using a block having a long tBERASE may be reduced. However, in the memory system 1 of the present embodiment, each block having a long tBERASE is set to the defective block. Thus, the reduction in reliability of the memory system 1 is prevented. More specifically, when writing and erasing are repeated for each block, the distribution of threshold voltage after erase shown in FIG. 8 and FIG. 9 becomes wide along the horizontal axis. The shape of the distribution of threshold voltage largely differs even among the blocks having the same number of erases. It is necessary to repeat the erase voltage application process, in other words, with increase the iteration count, to reduce the fail bit count obtained in the erase verification process. However, a block, which has degraded to such an extent that tBERASE is long, contains a large number of memory cells of which threshold voltage is not less than the erase verification voltage) even if the iteration count is increased. In other words, such a block contains a large number of memory cells which are not changed to the erase state even if the iteration count is increased, i.e., the fail bit count increases. Even when data erase operation is determined as pass in the erase verification process, some memory cells are still not in the erase state, or some memory cells are not easily changed to the erase state before the data erase is determined as pass in the erase verification process. When the iteration count is increased, erase voltage is excessively applied to the memory cells which are easily changed to the erase state. In this way, a large difference is generated in the threshold voltage between memory cells which are not changed to the erase state or are not easily changed to the erase state, and memory cells which are easily changed to the erase state. Thus, the distribution of threshold voltage becomes wide. The reliability of each block of which the distribution of threshold voltage is wide is low. Thus, such a block is preferably set to a defective block.

In the present embodiment, the process transfers from the second controller 27 to the first controller 3 and returns to the second controller 27 within a single iteration which begins with the application of erase voltage in the erase voltage application process and ends before the next application of erase voltage in the erase voltage application process. However, all of the steps related to the iteration which begins with the application of erase voltage in the erase voltage application process and ends before the next application of erase voltage in the erase voltage application process, specifically, all of the steps S1501 to S1508 of FIG. 15, may be performed in the second controller 27 of the NAND flash memory 2. In this case, a plurality of iterations are executed on the NAND flash memory 2 side in response to a single request of erase operation from the first controller 3 to the second controller 27. When a plurality of iterations are executed on the NAND flash memory 2 side, the iteration count and tBERASE are managed by the sum from the start time of erase operation. Steps from S1501 to S1508 of FIG. 15, steps S1505 and S1506 may be performed by the first controller 3 instead of the second controller 27.

[Second Embodiment]

In the present embodiment, a modification example of the first embodiment is explained.

Figure 16:
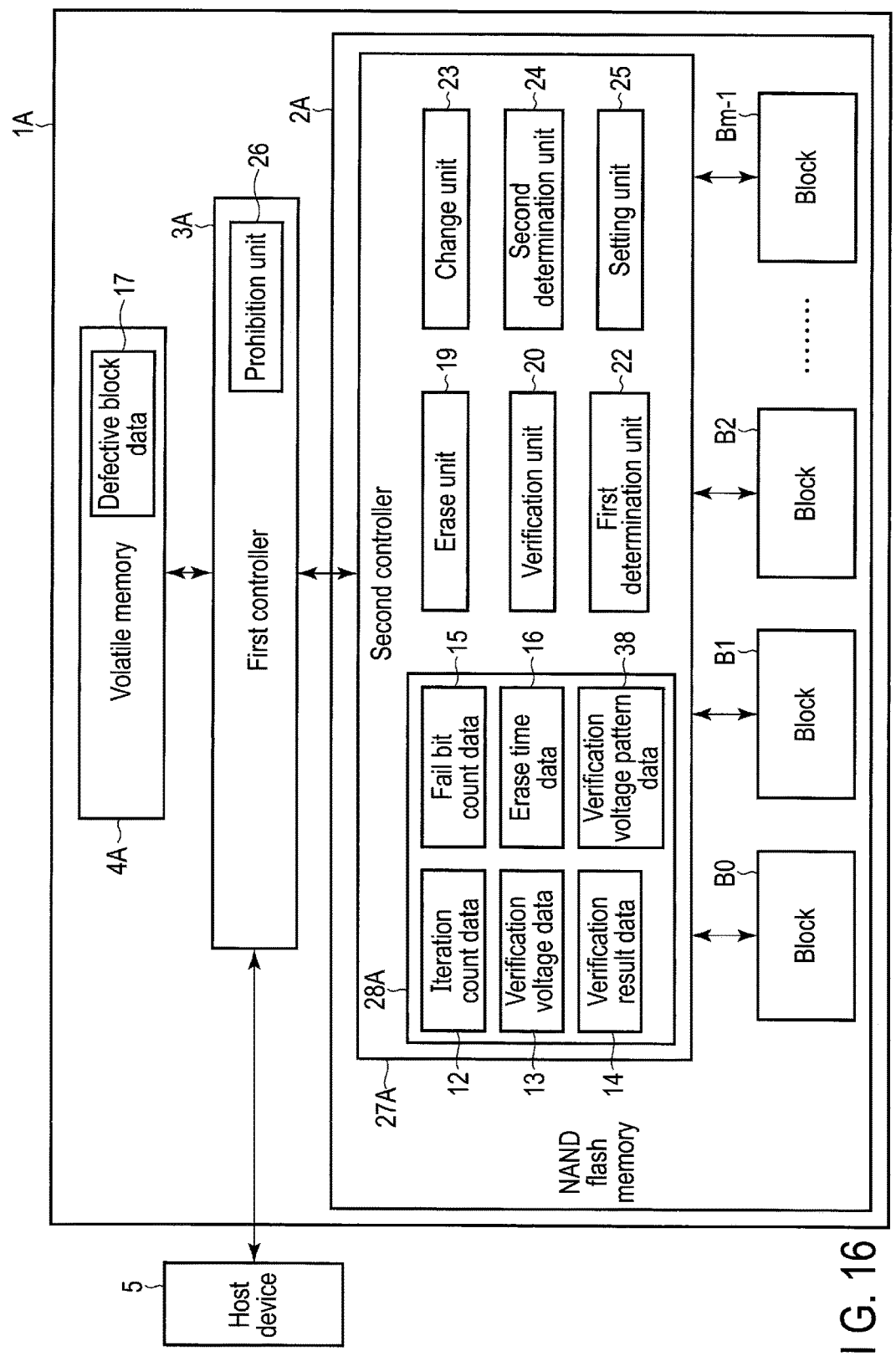
FIG. 16 is a block diagram showing an example of a configuration of a memory system according to a second embodiment.

FIG. 16 is a block diagram showing an example of a configuration of a memory system 1A according to the present embodiment.

The memory system 1A is connected to the host device 5, and includes a NAND flash memory 2A, a first controller 3A and a volatile memory 4A.

The NAND flash memory 2A includes a second controller 27A. The second controller 27A includes a memory 28A. The memory 28A may be provided outside the second controller 27A. Part of physical blocks B0 to Bm−1 may be used for the memory 28A.

The second controller 27A is capable of performing the same processes as those of the erase unit 19, the verification unit 20, the first determination unit 22, the change unit 23, the second determination unit 24 and the setting unit 25 related to the erase operation explained in the first embodiment.

The first controller 3A corresponds to the first controller 3 of the first embodiment, and includes the prohibition unit 26. However, the first controller 3A may not execute the functions of the first determination unit 22, the change unit 23, the second determination unit 24 or the setting unit 25 executed by the first controller 3 of the first embodiment.

The memory 28A stores the verification voltage pattern data 38, the verification voltage data 13 and the erase time data 16, which are stored in the volatile memory 4 in the first embodiment, in addition to the iteration count data 12, the verification result data 14 and the fail bit count data 15.

The volatile memory 4A corresponds to the volatile memory 4 of the first embodiment, and stores the defective block data 17. In the present embodiment, the second controller 27A of the NAND flash memory 2 reads and writes the iteration count data 12, the verification voltage data 13, the verification result data 14, the fail bit count data 15, the erase time data 16 and the verification voltage pattern data 38 of the memory 28A. Thus, the volatile memory 4A may not store the verification voltage data 13, the erase time data 16 or the verification voltage pattern data 38, which are stored in the volatile memory 4 in the first embodiment.

In the present embodiment, the second controller 27A included in the NAND flash memory 2A executes the functions of the erase unit 19, the verification unit 20, the first determination unit 22, the change unit 23, the second determination unit 24 and the setting unit 25. In this way, the first controller 3A does not need to execute the functions of the first determination unit 22, the change unit 23, the second determination unit 24 or the setting unit 25 explained in the first embodiment in erase operation. Thus, in erase operation, the processing load of the first controller 3A of the present embodiment can be reduced in comparison with that of the controller 3 explained in the first embodiment.

[Third Embodiment]

In the present embodiment, a modification example of the first and second embodiments is explained.

FIG. 17 is a block diagram showing an example of a configuration of a memory system 1B according to the present embodiment. FIG. 17 shows, of the structures of the memory system 1B, a first controller 3B, and a second controller 27B and blocks B0 to Bm−1 provided in a NAND flash memory 2B. The other structure is omitted in FIG. 17 to simplify explanation.

The first controller 3B is an example of a memory controller configured to receive a command from an external host device (not shown in FIG. 17) and control the NAND flash memory 2B in accordance with the command.

In the present embodiment, the first controller 3B transmits an erase condition setting command 45 to the second controller 27B, transmits an erase command 46 to the second controller 27B, receives a ready/busy signal 47 from the second controller 27B, transmits a status read command 48 to the second controller 27B and receives status information 49 from the second controller 27B.

The erase condition setting command 45 is a command for setting, for example, erase voltage, erase verification voltage, the maximum memory iteration count and a verification determination value.

The first controller 3B notifies the second controller 27B of the value of the erase voltage used in an erase voltage application process performed by the second controller 27B with the erase condition setting command 45. However, when the erase voltage application process and an erase verification process are repeatedly performed in the second controller 27B, the erase voltage used in the erase voltage application process is updated by the second controller 27B. The erase voltage corresponds to, for example, erase voltages Vera1, Vera2 and Vera3 shown in FIG. 6.

The erase verification voltage is voltage applied to the word line WL in the erase verification process. The erase verification voltage corresponds to, for example, erase verification voltages Vevfy1, Vevfy2 and Vevfy3 shown in FIG. 6.

The maximum memory iteration count indicates the maximum count for iterating the erase voltage application process and the erase verification process in the NAND flash memory 2B in accordance with the erase command 46.

The verification determination value is a value to determine, for example, the pass of the erase verification process. In other words, the verification determination value is equivalent to the maximum fail bit count for determining the status as pass. In the present embodiment, for example, the verification determination value can be the greater one out of the change threshold and the verification fail bit count threshold. In this case, normally, the change threshold is greater than the verification fail bit count threshold, and thus, the verification determination value is the change threshold.

For example, the erase command 46 is a command including a block address and for requesting erase of the data of an erase target block corresponding to the block address.

The ready/busy signal 47 is a signal indicating that the NAND flash memory 2B is in a ready state or a busy state when the second controller 27B receives the erase command 46 from the first controller 3B. For example, the first controller 3B may be in a wait state and may not transmit the next command to the second controller 27B while the ready/busy signal 47 received from the second controller 27B indicates the busy state. For example, the first controller 3B may transmit the next command to the NAND flash memory 2B after confirming that the ready/busy signal 47 received from the second controller 27B indicates the ready state. In the present embodiment, the transmission of the ready/busy signal 47 from the second controller 27B to the first controller 3B may be omitted. For the sake of convenience, the explanation of the ready/busy signal 47 is omitted below.

The status read command 48 is a command for requesting read of the status information 49 of the NAND flash memory 2B.

The status information 49 indicates the status of the NAND flash memory 2B. More specifically, the status information 49 includes, for example, a pass/fail signal indicating the pass/fail of the erase verification process, the fail bit count for the erase target block, and the memory iteration count indicating the iteration count of the processes performed in the NAND flash memory 2B in correspondence with the erase command 46. In the present embodiment, the fail/pass signal included in the status information 49 is not used in the first controller 3B. Thus, the pass/fail signal may be deleted from the status information 49.

Figure 18:
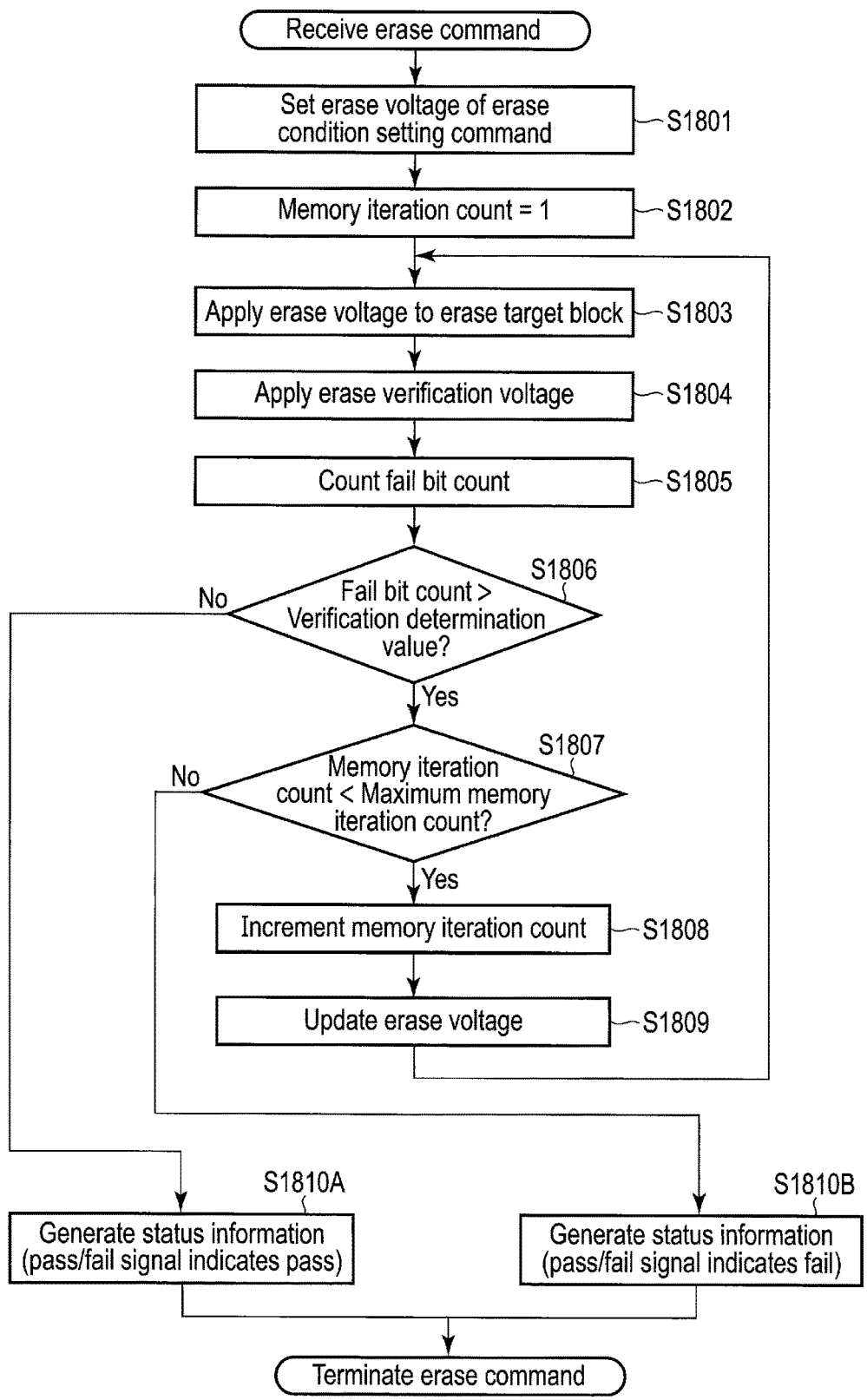
FIG. 18 is a flowchart showing an example of a process performed by a second controller according to the third embodiment which has received an erase command.
Figure 19:
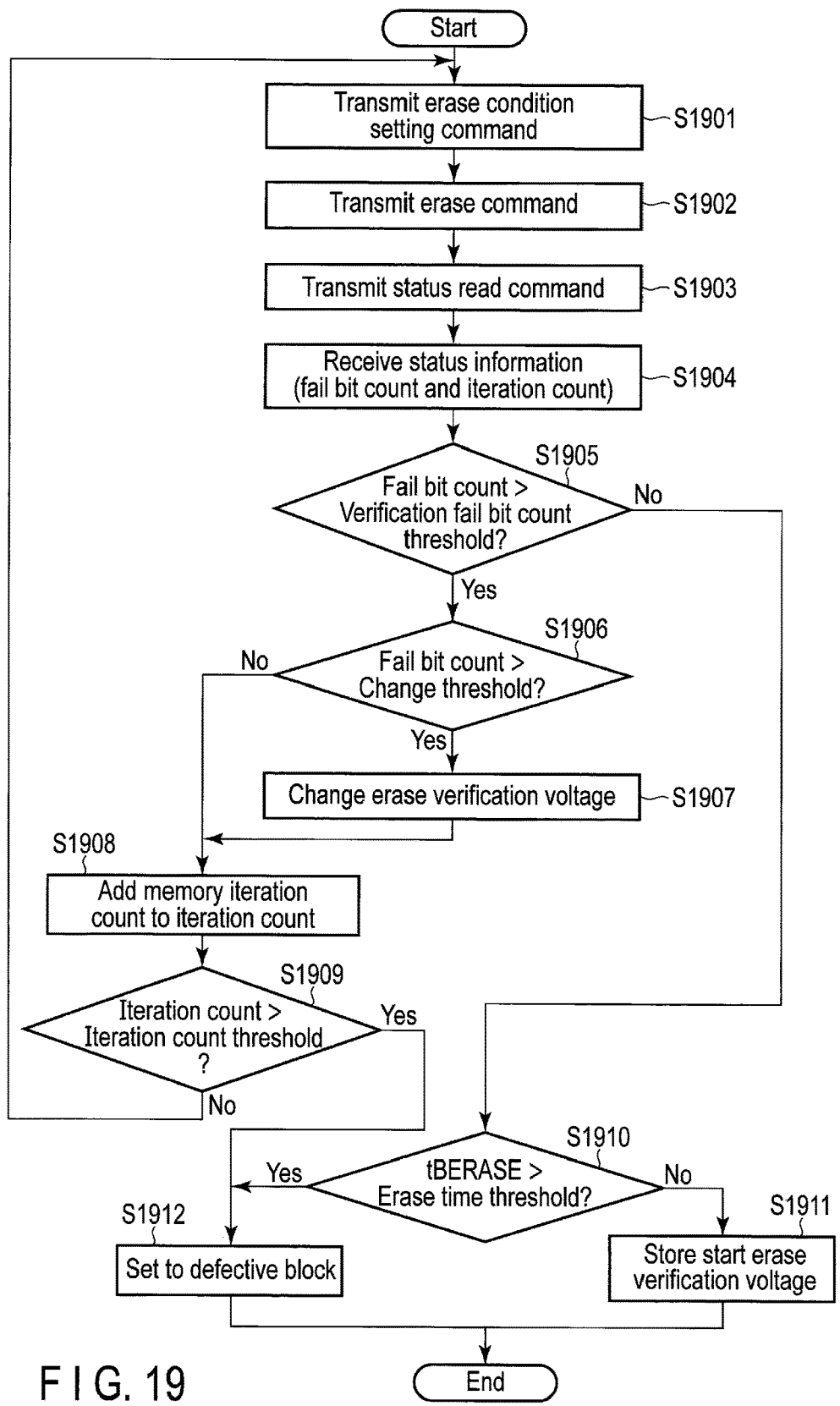
FIG. 19 is a flowchart showing an example of a process performed by a first controller according to the third embodiment.

In FIG. 18 and FIG. 19 explained below, the process of FIG. 15 is clearly divided into a process performed by the second controller 27B and a process performed by the first controller 3B.

FIG. 18 is a flowchart showing an example of the process performed by the second controller 27B which has received the erase command 46.

In step S1801, the second controller 27B sets the erase voltage to be used in the erase voltage application process to the erase voltage set by the erase condition setting command 45.

In step S1802, the second controller 27B sets the memory iteration count to one.

In step S1803, the second controller 27B applies the erase voltage to the erase target block indicated by the block address included in the erase command 46.

In step S1804, the second controller 27B applies the erase verification voltage to a word line WL corresponding to the erase target block. Here, the erase verification voltage is the voltage set by the erase condition setting command 45. The erase verification voltage is voltage to be used in the erase verification process.

In step S1805, the second controller 27B counts the fail bit count.

In step S1806, the second controller 27B determines whether the fail bit count exceeds the verification determination value set by the erase condition setting command 45.

When the fail bit count does not exceed the verification determination value, the second controller 27B generates status information 49 including a pass/fail signal indicating pass, the fail bit count and the memory iteration count in step S1810A. The process of FIG. 18 performed when the erase command 46 is received is terminated. When the second controller 27B receives the status read command 48 from the first controller 3B, the second controller 27B transmits the generated status information 49 to the first controller 3B.

When the fail bit count exceeds the verification determination value, the second controller 27B determines whether the memory iteration count is less than the maximum memory iteration count set by the erase condition setting command 45 in step S1807.

When the memory iteration count is greater than or equal to the maximum memory iteration count, the second controller 27B generates status information 49 including a pass/fail signal indicating fail, the fail bit count and the memory iteration count in step S1810B. The process of FIG. 18 performed when the erase command 46 is received is terminated. When the second controller 27B receives the status read command 48 from the first controller 3B, the second controller 27B transmits the generated status information 49 to the first controller 3B.

When the memory iteration count is less than the maximum memory iteration count, the second controller 27B increments the memory iteration count in step S1808. In step S1809, the second controller 27B updates the erase voltage. The process returns to step S1803. The erase voltage is updated by, for example, adding a step-up width ΔVera of the erase voltage to the current erase voltage. The step-up width ΔVera of the erase voltage may be included, for example, the erase condition setting command 45. In this case, the second controller 27B updates the erase voltage, using the step-up width ΔVera included in the erase condition setting command 45.

In the process of FIG. 18, for example, when the maximum memory iteration count is set to N, where N is an integer greater than or equal to one, the erase voltage application process of step S1803 and the erase verification process of step S1804 are performed N times at a maximum, and the status information 49 is generated. Subsequently, the control is returned from the second controller 27B to the first controller 3B.

FIG. 19 is a flowchart showing an example of the process performed by the first controller 3B according to the present embodiment.

In FIG. 19, initially, the iteration count and the erase time (for example, tBERASE) are zero.

In step S1901, the first controller 3B obtains the erase voltage to be used in the erase voltage application process and transmits the erase condition setting command 45 for setting the erase voltage to the second controller 27B. The erase voltage may be obtained from, for example, [default start erase voltage Verad+(iteration count×ΔVera)]. The default start erase voltage Verad corresponds to, for example, the erase voltage Vera1 shown in FIG. 6.

In step S1902, the first controller 3B transmits the erase command 46 to the second controller 27B. For example, the first controller 3B may measure tBERASE by accumulating processing time corresponding to the erase command 46.

The second controller 27B which has received the erase command 46 performs, for example, the process of FIG. 18.

In step S1903, the first controller 3B transmits the status read command 48 to the second controller 27B.

In step S1904, the first controller 3B receives the status information 49 from the second controller 27B.

In step S1905, the first controller 3B determines whether the fail bit count exceeds the verification fail bit count threshold. When the fail bit count exceeds the verification fail bit count threshold, the process moves to step S1906. When the fail bit count does not exceed the verification fail bit count threshold, the process moves to step S1910.

Steps S1906 to S1907 of FIG. 19 performed by the first controller 3B correspond to steps S1505 to S1506 of FIG. 15. Thus, the explanation of these steps is omitted.

When it is determined that the fail bit count exceeds the change threshold in step S1906, or when the erase verification voltage is changed in step S1907, the first controller 3B adds the memory iteration count included in the status information 49 to the iteration count in step S1908. Subsequently, the process moves to step S1909.

Steps S1909 to S1912 of FIG. 19 performed by the first controller 3B correspond to steps S1508 to S1511 of FIG. 15. Thus, the explanation of these steps is omitted.

Figure 20:
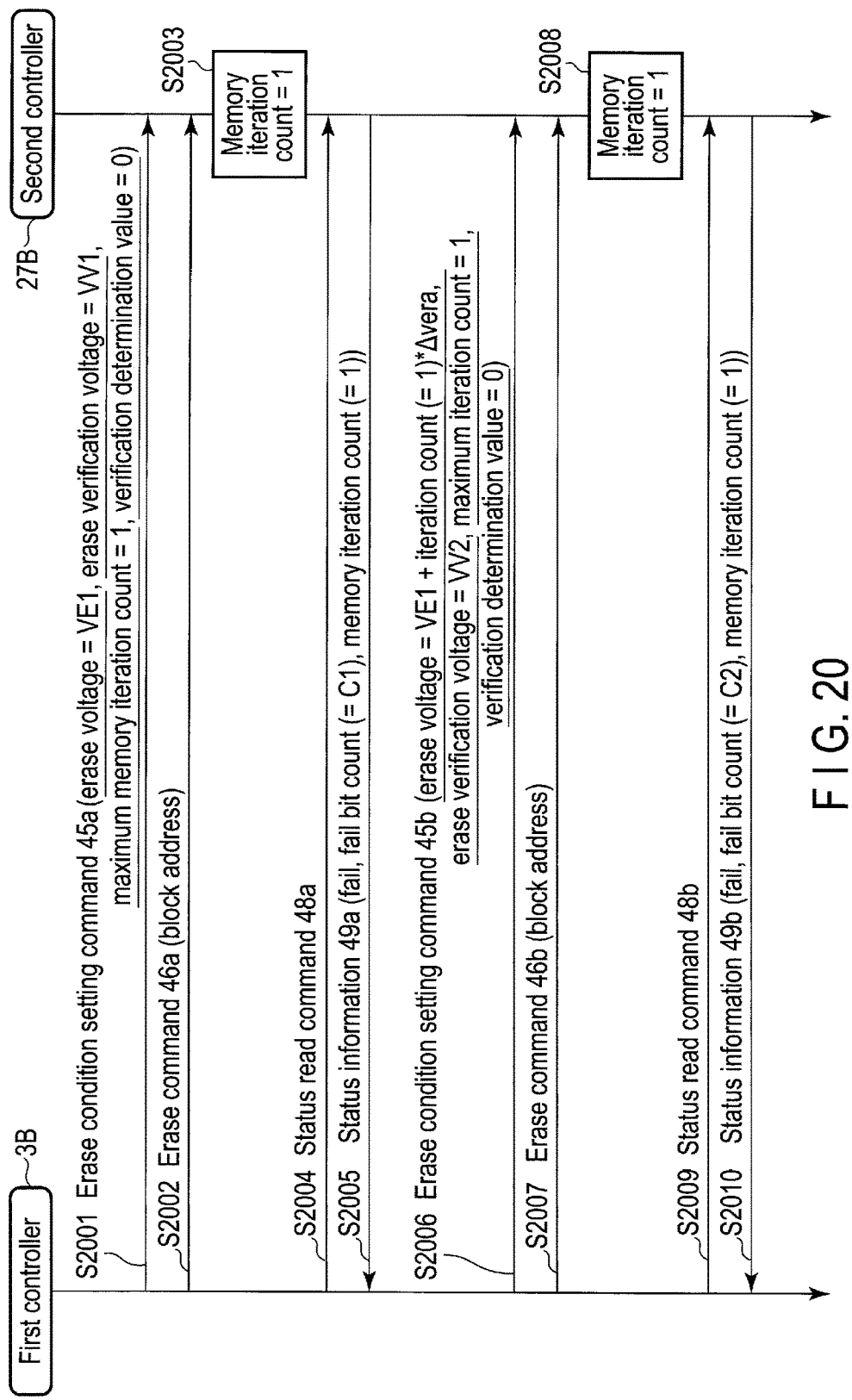
FIG. 20 is a sequence diagram showing a first example of a process performed by the memory system according to the third embodiment.

FIG. 20 is a sequence diagram showing an example of a process performed when an erase condition setting command 45a indicating that the maximum memory iteration count is one is transmitted from the first controller 3B to the second controller 27B, and subsequently, an erase condition setting command 45b indicating that the maximum memory iteration count is one which is transmitted from the first controller 3B to the second controller 27B.

In FIG. 20, erase commands 46a and 46b are transmitted from the first controller 3B to the second controller 27B. FIG. 20 shows that the erase verification process is unsuccessful.

In step S2001, an erase condition setting command 45a is transmitted from the first controller 3B to the second controller 27B.

Erase condition setting command 45a indicates that: erase voltage is set to VE1; erase verification voltage is set to VV1; the maximum memory iteration count is set to one; and the verification determination value is set to zero.

In step S2002, an erase command 46a is transmitted from the first controller 3B to the second controller 27B.

In step S2003, the second controller 27B performs a process for applying the erase voltage VE1 to the erase target block, a process for applying the erase verification voltage VV1 to the erase target block, a process for counting the fail bit count, a process for determining whether the counted fail bit count C1 exceeds zero, a process for determining whether the memory iteration count is less than the maximum memory iteration count, etc. For example, when the fail bit count C1 exceeds zero, and the memory iteration count is the same as the maximum memory iteration count, the second controller 27B generates status information 49a indicating fail.

Step S2003 corresponds to steps S1801 to S1807 and S1810B of FIG. 18.

In step S2004, a status read command 48a is transmitted from the first controller 3B to the second controller 27B.

In step S2005, the generated status information 49a is transmitted from the second controller 27B to the first controller 3B. The status information 49a includes a pass/fail signal indicating fail, the fail bit count indicating C1 and the memory iteration count indicating one.

In step S2006, an erase condition setting command 45b is transmitted from the first controller 3B to the second controller 27B.

The erase condition setting command 45b indicates that: erase voltage is set to [VE1+(iteration count×ΔVera)]; erase verification voltage is set to VV2; the maximum memory iteration count is set to one; and the verification determination value is set to zero.

In step S2007, an erase command 46b is transmitted from the first controller 3B to the second controller 27B.

In step S2008, the second controller 27B performs a process for applying the erase voltage [VE1+(iteration count× ΔVera)] to the erase target block, a process for applying the erase verification voltage VV2 to the erase target block, a process for counting the fail bit count, a process for determining whether the counted fail bit count C2 exceeds zero, a process for determining whether the memory iteration count is less than the maximum memory iteration count. For example, when the fail bit count C2 exceeds zero, and the memory iteration count is the same as the maximum memory iteration count, the second controller 27B generates status information 49b indicating fail.

Step S2008 corresponds to steps S1801 to S1807 and S1810B of FIG. 18.

In step S2009, a status read command 48b is transmitted from the first controller 3B to the second controller 27B.

In step S2010, the generated status information 49b is transmitted from the second controller 27B to the first controller 3B. The status information 49b includes a pass/fail signal indicating fail, the fail bit count indicating C2 and the memory iteration count indicating one.

Figure 21:
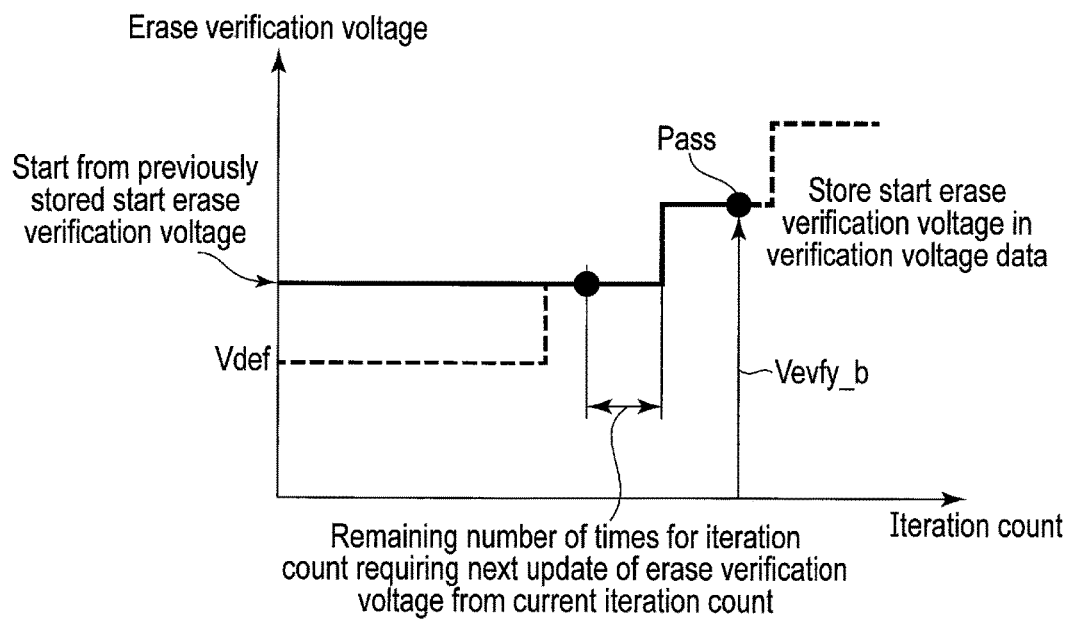
FIG. 21 is a conceptual diagram showing an example of a method for determining a maximum memory iteration count in the first controller according to the third embodiment.

FIG. 21 is a conceptual diagram showing an example of a method for determining the maximum memory iteration count in the first controller 3B. In FIG. 21, the explanation of the same portions as FIG. 11 is omitted.

For example, the erase voltage application process and the erase verification process are iterated based on the control of the second controller 27B while the erase verification process is performed with the identical erase verification voltage. When the iteration count reaches the iteration count requiring a change in the erase verification voltage, the control is returned from the second controller 27B to the first controller 3B. In this way, the first controller 3B is capable of transmitting the erase condition setting command 45 for changing the erase verification voltage to the second controller 27B.

In other words, the first controller 3B sets, as the maximum memory iteration count, the remaining number of times for the iteration count requiring the next update of the erase verification voltage from the current iteration count, and generates the erase condition setting command 45.

In place of the method for determining the maximum memory iteration count shown in FIG. 21, the maximum memory iteration count may be determined based on other standards. For example, when the load on a process performed by the first controller 3B is high, the iteration count by the second controller 27B may be increased such that the load on the process performed by the first controller 3B is reduced.

Figure 22:
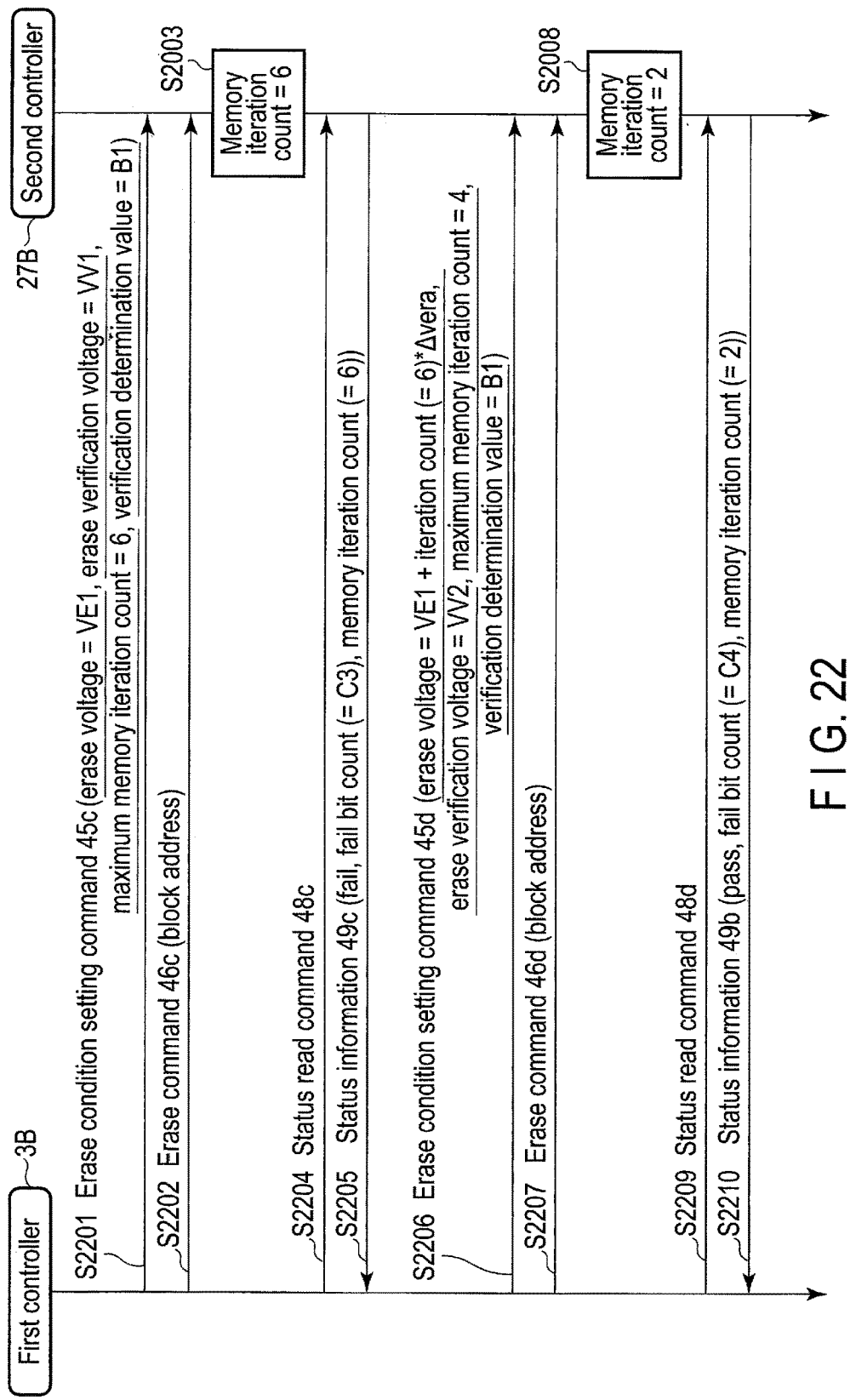
FIG. 22 is a sequence diagram showing a first example of a process performed by the memory system according to the third embodiment.

FIG. 22 is a sequence diagram showing an example of a process performed when an erase condition setting command 45c indicating that the maximum memory iteration count is six is transmitted from the first controller 3B to the second controller 27B, and subsequently, an erase condition setting command 45d indicating that the maximum memory iteration count is four is transmitted from the first controller 3B to the second controller 27B.

FIG. 22 shows that the erase verification process is determined as pass when the erase voltage application process and the erase verification process are performed twice in the second controller 27B in accordance with the second issued erase command 46d.

In step S2201, an erase condition setting command 45c is transmitted from the first controller 3B to the second controller 27B.

The erase condition setting command 45c indicates that: erase voltage is set to VE1; erase verification voltage is set to VV1; the maximum memory iteration count is set to six; and the verification determination value is set to B1.

In step S2202, an erase command 46c is transmitted from the first controller 3B to the second controller 27B.

In step S2203, the second controller 27B sets the erase voltage to VE1, sets the erase verification voltage to VV1, sets the maximum memory iteration count to six and sets the verification determination value to B1. The second controller 27B repeats the process of steps S1801 to S1809 of FIG. 18 until the memory iteration count reaches six as the maximum memory iteration count. The second controller 27B generates status information 49c. It is assumed that, when the status information 49c is generated, the fail bit count is C3, and the memory iteration count is six.

In step S2204, a status read command 48c is transmitted from the first controller 3B to the second controller 27B.

In step S2205, the generated status information 49c is transmitted from the second controller 27B to the first controller 3B. The status information 49c includes a pass/fail signal indicating fail, a fail bit count indicating C3 and a memory iteration count indicating six. The fail bit count C3 is a value exceeding verification determination value B1.

In step S2206, an erase condition setting command 45d is transmitted from the first controller 3B to the second controller 27B.

The erase condition setting command 45d indicates that: erase voltage is set to [VE1+(iteration count (=6)×ΔVera)]; erase verification voltage is set to VV2; the maximum memory iteration count is set to four; and the verification determination value is set to B1.

In step S2207, an erase command 46d is transmitted from the first controller 3B to the second controller 27B.

In step S2208, the second controller 27B sets the erase voltage to [VE1+(6× ΔVera)], sets the erase verification voltage to VV2, sets the maximum memory iteration count to four, sets the verification determination value to B1, and repeats the process of steps S1801 to S1809 of FIG. 18.

In the example of FIG. 22, after the memory iteration count reaches two, the erase voltage application process and the erase verification process with the erase verification voltage VV2 are performed. Thus, the fail bit count C4 is changed to a value less than or equal to the verification determination value B1. As a result, the second controller 27B generates status information 49d indicating pass.

In step S2209, a status read command 48d is transmitted from the first controller 3B to the second controller 27B.

In step S2210, the generated status information 49d is transmitted from the second controller 27B to the first controller 3B. The status information 49d includes a pass/fail signal indicating pass, the fail bit count indicating C4 and the memory iteration count indicating two.

As explained above, in the present embodiment, the first controller 3B is capable of specifying the maximum iteration count of the erase voltage application process and the erase verification process performed in the second controller 27B. In this way, the processing load on the first controller 3B and the second controller 27B can appropriately balance.

In the present embodiment, the second controller 27B is capable of performing the erase voltage application process and the erase verification process in the range of the iteration count in which the erase verification voltage is not changed. Subsequently, the second controller 27B is capable of returning the control to the first controller 3B. In the present embodiment, when the verification determination value is the changed threshold, and the fail bit count is less than or equal to the changed threshold, the second controller 27B is capable of terminating the iteration of the erase voltage application process and the erase verification process, and returning the control to the first controller 3B. In this manner, it is possible to provide the first controller 3B with an opportunity to change the erase verification voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory; and
a controller controlling to the nonvolatile memory, wherein the controller is configured to
repeatedly perform an erase voltage application process for data stored in an erase target area in the nonvolatile memory,
perform an erase verification process for determining whether the erase of the data is successful using erase verification voltage, the erase verification process corresponding to each of the repeatedly performed erase voltage application processes,
change, when the erase of the data is not successful in the erase verification process, the erase verification voltage to new erase verification voltage to be used in a next erase verification process,
determine, when the erase of the data is successful, whether an erase time is longer than a first threshold value, the erase time being a time that the controller takes to determine that the erase of the data in the erase target area is successful, and
set the erase target area to a use prohibition state when the erase time is longer than the first threshold value, wherein
the controller is further configured to generate fail bit count data indicating a number of bits in which erase is not successful in the erase target area when the controller determines that the erase of the data is not successful in the erase verification process,
change the erase verification voltage to the new erase verification voltage when the number of bits indicated by the fail bit count data is larger than a second threshold value, and
determine that the erase of the data is successful when the number of bits indicated by the fail bit count is less than a third threshold value, the third threshold value being smaller than the second threshold value.

2. The memory system of claim 1, wherein
the controller is configured to change the erase verification voltage to the new erase verification voltage so that the controller is more unlikely to determine that the erase of the data is successful than the current erase verification voltage.

3. The memory system of claim 2, wherein
the controller is configured to change the erase verification voltage to the new erase verification voltage when the number of performing the erase voltage application process is larger than a fourth threshold value.

4. The memory system of claim 1, wherein the controller is further configured to
when the erase time is less than or equal to the first threshold value, set the erase verification voltage used in the erase verification process in which the erase of the data is determined to be successful as start erase verification voltage initially used in next erase for the erase target area.

5. The memory system of claim 1, wherein the controller comprises a first controller and a second controller,
the first controller is configured to communicate with an external host device,
the second controller is configured to control the nonvolatile memory in accordance with a command received from the first controller, and perform the erase voltage application process and the erase verification process,
the first controller is further configured to transmit, to the second controller, a maximum iteration count for the erase voltage application process and the erase verification process, and
the second controller is further configured to determine whether an iteration count of the erase voltage application process and the erase verification process is less than the maximum iteration count, and return a response to the first controller when a result of the erase verification process is successful or when the iteration count is greater than or equal to the maximum iteration count.

6. The memory system of claim 1, wherein the controller comprises a first controller and a second controller,
the first controller is configured to communicate with an external host device,
the second controller is configured to control the nonvolatile memory in accordance with a command received from the first controller,
the first controller is further configured to transmit, to the second controller, an erase condition setting command for setting erase voltage used in the erase voltage application process, the erase verification voltage, a maximum iteration count for the erase voltage application process and the erase verification process, and a verification determination parameter used to determine that the erase of the data is successful, and subsequently transmit an erase command to the second controller, and
the second controller is further configured to:
when the second controller receives the erase condition setting command from the first controller, set the erase voltage, the erase verification voltage, the maximum iteration count and the verification determination parameter in accordance with the erase condition setting command; and
when the second controller receives the erase command from the first controller, perform the erase voltage application process and the erase verification process, determine whether a result of the erase verification process is successful based on the verification determination parameter, determine whether an iteration count of the erase voltage application process and the erase verification process is less than the maximum iteration count, and return a response to the first controller when the result of the erase verification process is successful or when the iteration count is greater than or equal to the maximum iteration count.

7. The memory system of claim 1, wherein the controller is further configured to stop repeating the erase voltage application process when erase of the data is determined to be successful or when a number of performing the erase voltage application process is larger than a fifth threshold value.

8. A memory system comprising:
a nonvolatile memory; and
a controller controlling to the nonvolatile memory, wherein the controller is configured to
repeatedly perform an erase voltage application process for data stored in an erase target area in the nonvolatile memory,
perform an erase verification process for determining whether the erase of the data is successful using erase verification voltage, the erase verification process corresponding to each of the repeatedly performed erase voltage application processes,
determine whether an erase time is longer than a first threshold value, the erase time being a time that the controller takes to determine that the erase of the data in the erase target area is successful, and
set the erase target area to a use prohibition state when the erase time is longer than the first threshold value, wherein the controller is further configured to generate fail bit count data indicating a number of bits in which erase is not successful in the erase target area when the controller determines that the erase of the data is not successful in the erase verification process,
change the erase verification voltage to the new erase verification voltage when the number of bits indicated by the fail bit count data is larger than a second threshold value, and
determine that the erase of the data is successful when the number of bits indicated by the fail bit count is less than a third threshold value, the third threshold value being smaller than the second threshold value.

9. The memory system of claim 8, wherein the controller comprises a first controller and a second controller,
the first controller is configured to communicate with an external host device,
the second controller is configured to control the nonvolatile memory in accordance with a command received from the first controller, and perform the erase voltage application process and the erase verification process,
the first controller is further configured to transmit, to the second controller, a maximum iteration count for the erase voltage application process and the erase verification process, and
the second controller is further configured to determine whether an iteration count of the erase voltage application process and the erase verification process is less than the maximum iteration count, and return a response to the first controller circuit when a result of the erase verification process is successful or when the iteration count is greater than or equal to the maximum iteration count.

10. The memory system of claim 8, wherein the controller comprises a first controller and a second controller,
the first controller is configured to communicate with an external host device,
the second controller is configured to control the nonvolatile memory in accordance with a command received from the first controller,
the first controller is further configured to transmit, to the second controller circuit, an erase condition setting command for setting erase voltage used in the erase voltage application process, the erase verification voltage, a maximum iteration count for the erase voltage application process and the erase verification process performed by the second controller and a verification determination parameter used to determine that the erase of the data is successful, and subsequently transmit an erase command to the second controller, and
the second controller is further configured to:
when the second controller receives the erase condition setting command from the first controller, set the erase voltage, the erase verification voltage, the maximum iteration count and the verification determination parameter in accordance with the erase condition setting command; and
when the second controller receives the erase command from the first controller, perform the erase voltage application process and the erase verification process, determine whether a result of the erase verification process is successful based on the verification determination parameter, determine whether an iteration count of the erase voltage application process and the erase verification process is less than the maximum iteration count, and return a response to the first controller when the result of the erase verification process is successful or when the iteration count is greater than or equal to the maximum iteration count.

11. The memory system of claim 8, wherein the controller is further configured to stop repeating the erase voltage application process when erase of the data is determined to be successful or when the number of performing the erase voltage application process is larger than an upper limit value.

12. A control method for erasing data from a nonvolatile memory, the control method comprising:
   repeatedly performing an erase voltage application process for the data stored in an erase target area in the nonvolatile memory, and performing an erase verification process for determining whether erase of the data is successful using erase verification voltage, the erase verification process corresponding to each of the repeatedly performed erase voltage application processes;
   changing, when it is determined that the erase of the data is not successful in the erase verification process, the erase verification voltage to new erase verification voltage to be used in a next erase verification process;
   determining, when it is determined that the erase of the data is successful, whether an erase time is longer than a first threshold value, the erase time being a time to determine that the erase of the data to be successful in the erase target area; and
   setting the erase target area to a use prohibition state when the erase time is longer than the first threshold value, wherein
   the erase verification process includes generating fail bit count data indicating a number of bits in which erase is not successful in the erase target area when it is determined that the erase of the data is not successful in the erase verification process,
   the changing includes a change in the erase verification voltage to the new erase verification voltage when the number of bits indicated by the fail bit count data is larger than a second threshold value, and
   the control method further comprises determining that the erase of the data is successful when the number of bits indicated by the fail bit count is less than a third threshold value, the third threshold value being smaller than the second threshold value.

13. The control method of claim 12, wherein
   the changing includes a change in the erase verification voltage to the new erase verification voltage so that determining the erase of the data to be successful is more unlikely than the current erase verification voltage.

14. The control method of claim 13, wherein
   the changing includes a change in the erase verification voltage to the new erase verification voltage when the number of performing the erase voltage application process is larger than a fourth threshold value.

15. The control method of claim 12, further comprising:
   setting the erase verification voltage used in the erase verification process in which the erase of the data is determined to be successful as start erase verification voltage initially used in next erase for the erase target area when the erase time is less than or equal to the first threshold value.

16. The control method of claim 12, further comprising stopping repeating the erase voltage application process when the erase of the data is determined to be successful in the erase verification process or when the number of performing the erase voltage application process is larger than a fifth threshold value.

* * * * *